(12) United States Patent
Conti et al.

(10) Patent No.: US 12,417,807 B2
(45) Date of Patent: Sep. 16, 2025

(54) MICROELECTRONIC DEVICES INCLUDING STAIRCASE STRUCTURES, AND RELATED MEMORY DEVICES, ELECTRONIC SYSTEMS, AND METHODS

(71) Applicant: Micron Technology, Inc., Boise, ID (US)

(72) Inventors: Anna Maria Conti, Milan (IT); Paolo Tessariol, Arcore (IT); Umberto Maria Meotto, Dietlikon (CH)

(73) Assignee: Micron Technology, Inc., Boise, ID (US)

( * ) Notice: Subject to any disclaimer, the term of this patent is extended or adjusted under 35 U.S.C. 154(b) by 437 days.

(21) Appl. No.: 17/930,279

(22) Filed: Sep. 7, 2022

(65) Prior Publication Data

US 2024/0079057 A1   Mar. 7, 2024

(51) Int. Cl.
| | |
|---|---|
| *G11C 16/04* | (2006.01) |
| *H10B 41/10* | (2023.01) |
| *H10B 41/20* | (2023.01) |
| *H10B 41/35* | (2023.01) |
| *H10B 43/10* | (2023.01) |
| *H10B 43/20* | (2023.01) |
| *H10B 43/35* | (2023.01) |

(52) U.S. Cl.
CPC ......... *G11C 16/0483* (2013.01); *H10B 41/10* (2023.02); *H10B 41/20* (2023.02); *H10B 41/35* (2023.02); *H10B 43/10* (2023.02); *H10B 43/20* (2023.02); *H10B 43/35* (2023.02)

(58) Field of Classification Search
CPC .... G11C 16/0483; H10B 41/10; H10B 41/20; H10B 41/35; H10B 43/10; H10B 43/20; H10B 43/35; H10B 41/50; H10B 43/50
See application file for complete search history.

(56) References Cited

U.S. PATENT DOCUMENTS

| | | | |
|---|---|---|---|
| 9,941,209 B2 | 4/2018 | Tessariol et al. | |
| 10,580,795 B1 | 3/2020 | Luo et al. | |
| 10,622,369 B2* | 4/2020 | Zhou | H10B 43/50 |
| 10,727,248 B2* | 7/2020 | Kaminaga | H10B 43/40 |
| 2025/0024685 A1* | 1/2025 | Zhou | H10D 30/6755 |

* cited by examiner

*Primary Examiner* — Allison Bernstein
(74) *Attorney, Agent, or Firm* — TraskBritt

(57) ABSTRACT

A microelectronic device comprises a stack structure overlying a source tier. The stack structure comprises a vertically alternating sequence of conductive structures and insulative structures arranged in tiers. The microelectronic device comprises a staircase structure within the stack structure and having steps comprising lateral edges of the tiers, conductive contacts within a horizontal area of the staircase structure and vertically extending through the stack structure to the source tier, and strapping structures laterally adjacent to the conductive contacts and having upper surfaces substantially coplanar with upper surfaces of the conductive contacts. Each of the strapping structures are in contact with one of the conductive contacts and with one of the conductive structures of the stack structure at one of the steps of the staircase structure. Related memory devices, electronic systems, and methods of forming the microelectronic devices are also described.

13 Claims, 14 Drawing Sheets

MICROELECTRONIC DEVICES INCLUDING STAIRCASE STRUCTURES, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices, and related memory devices, electronic systems, and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more conductive stack structures including tiers of conductive structures and insulative structures. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the conductive stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the conductive stack structure(s) of the memory device. The staircase structure includes individual "steps" defining contact regions of the conductive structures, upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the height of the stacks increases to facilitate additional memory cells in the vertical memory arrays, the stacks may be prone to toppling or collapse during various processing acts. For example, during replacement gate processing acts, the stacks may be subject to tier collapse during or after removal of portions of the tiers to be replaced with the conductive structures. Collapse of the portions of the stacks may reduce reliability of the vertical memory strings.

In addition, as the dimensions and spacing of the conductive features decrease, multilevel wiring structures have been used in memory devices to electrically connect the conductive features to one another. The memory device includes the wiring structures at different levels, with the wiring structures formed of electrically conductive materials to provide conductive pathways through the memory device. As the dimensions and spacing of the conductive features continue to decrease, parasitic (e.g., stray) capacitance between adjacent conductive features within the memory device increases. The increased parasitic capacitance causes higher power demands and delay of the memory device.

DETAILED DESCRIPTION

Figure 1A:
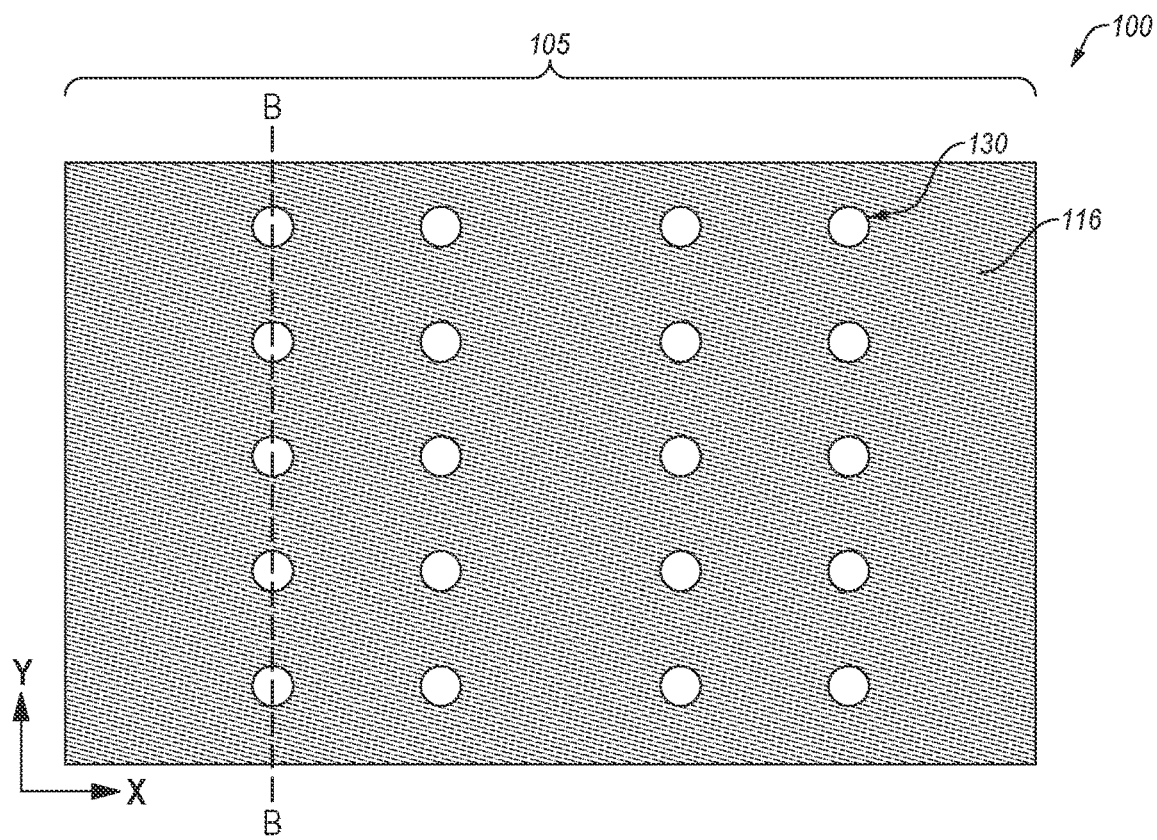
FIGS. 1A through 1N are simplified, partial top-down views (FIGS. 1A, 1F, and 1K) and simplified, partial cross-sectional views (FIGS. 1B through 1E, 1G through 1J, and 1L through 1N) illustrating different processing stages of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the claims. The drawings are not necessarily to scale. Additionally, elements common between figures may retain the same numerical designation.

As used herein, a "memory device" means and includes a microelectronic device exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional dynamic random-access memory (DRAM)), but also includes an application specific integrated circuit (ASIC) (e.g., a system on a chip (SoC)), a microelectronic device combining logic and memory, and a graphics processing unit (GPU) incorporating memory.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "amorphous," when referring to a material, means and refers to a material having a substantially noncrystalline structure.

As used herein, the term "sacrificial," when used in reference to a material or structure, means and includes a material, structure, or a portion of a material or structure that is formed during a fabrication process but which is at least partially removed (e.g., substantially removed) prior to completion of the fabrication process.

As used herein, the term "sacrificial," when used in reference to a material or structure, means and includes a material or structure that is formed during a fabrication process but which is removed (e.g., substantially removed) prior to completion of the fabrication process.

As used herein, the term "selectively etchable" means and includes a material that exhibits a greater etch rate responsive to exposure to a given etch chemistry relative to another material exposed to the same etch chemistry. For example, the material may exhibit an etch rate that is at least about three times (3×) greater than the etch rate of another material, such as about five times (5×) greater than the etch rate of another material, such as an etch rate of about ten times (10×) greater, about twenty times (20×) greater, or about forty times (40×) greater than the etch rate of the another material. Etch chemistries and etch conditions for selectively etching a desired material may be selected by a person of ordinary skill in the art.

Unless otherwise specified, materials described herein may be formed by conventional techniques including, but not limited to, spin coating, blanket coating, chemical vapor deposition (CVD), atomic layer deposition (ALD), plasma-enhanced ALD, physical vapor deposition (PVD), plasma-enhanced chemical vapor deposition (PECVD), or low-pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Figure 1B:
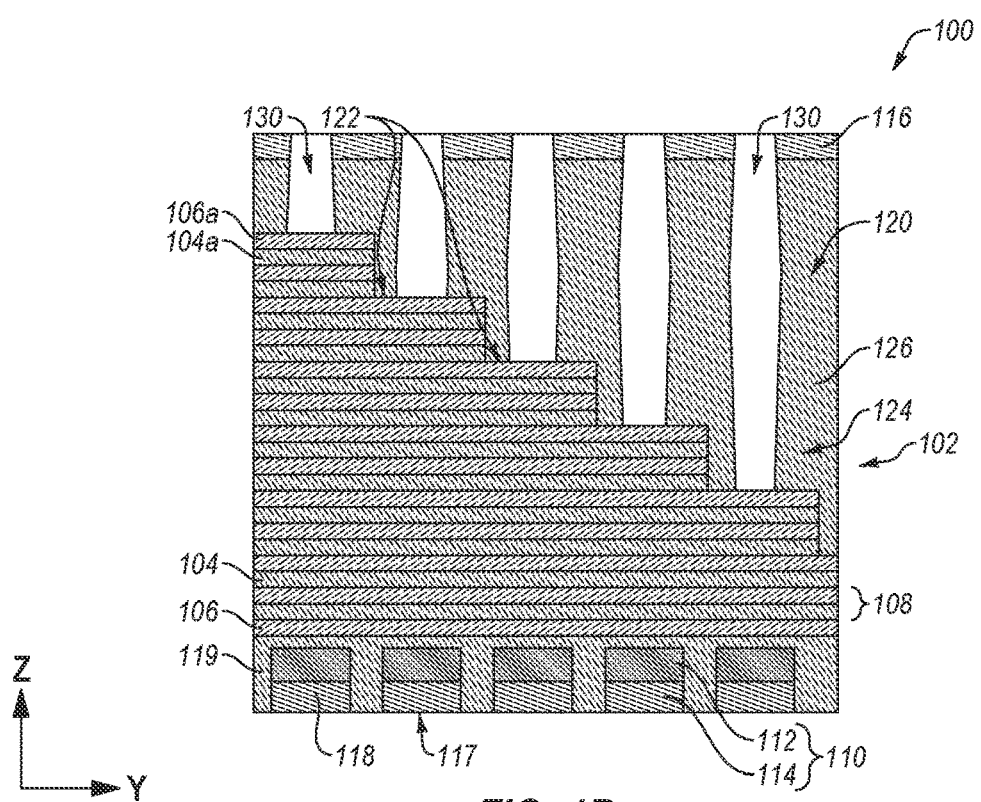
Figure 1C:
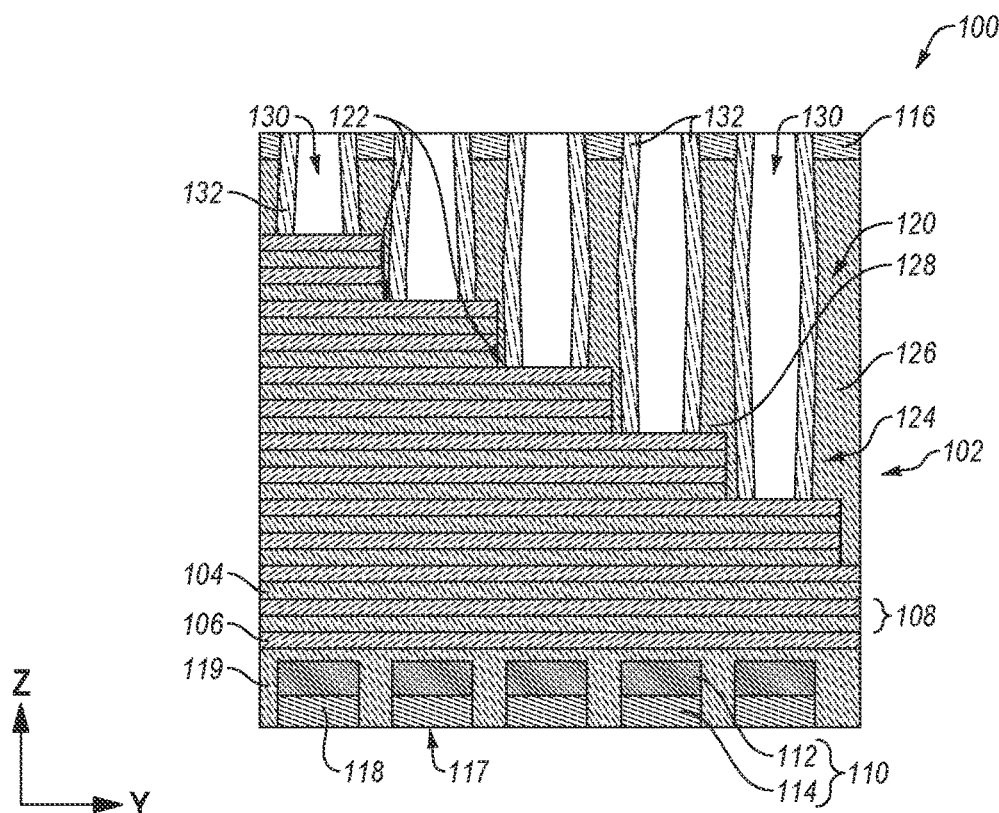
Figure 1D:
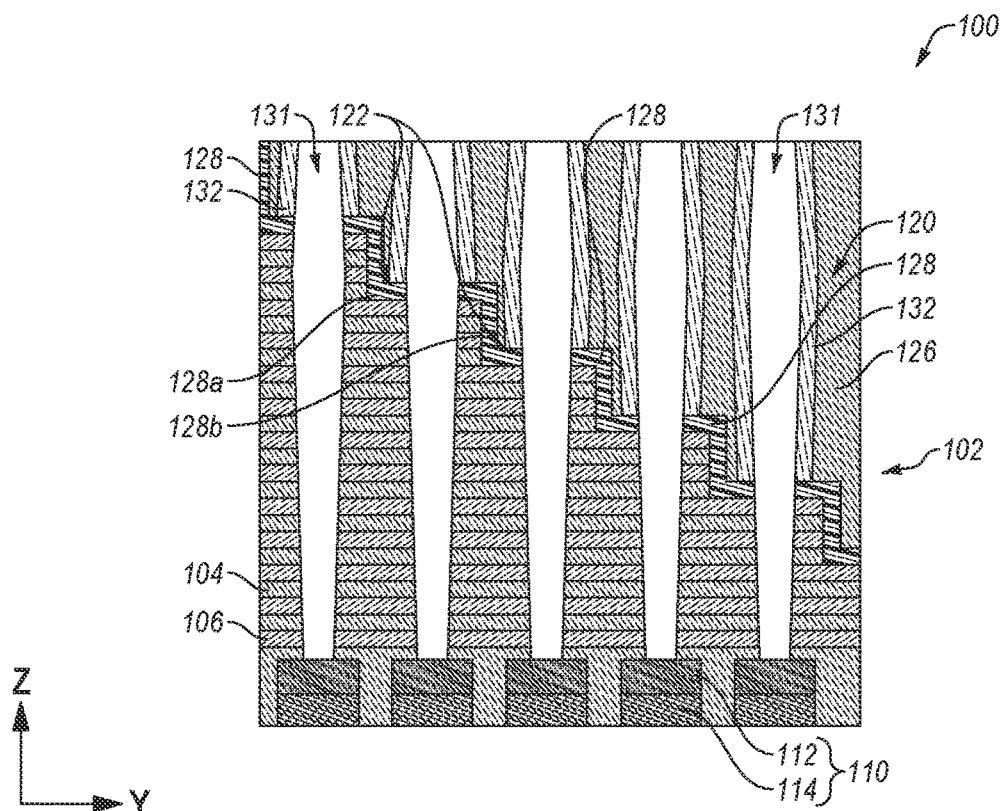
Figure 1E:
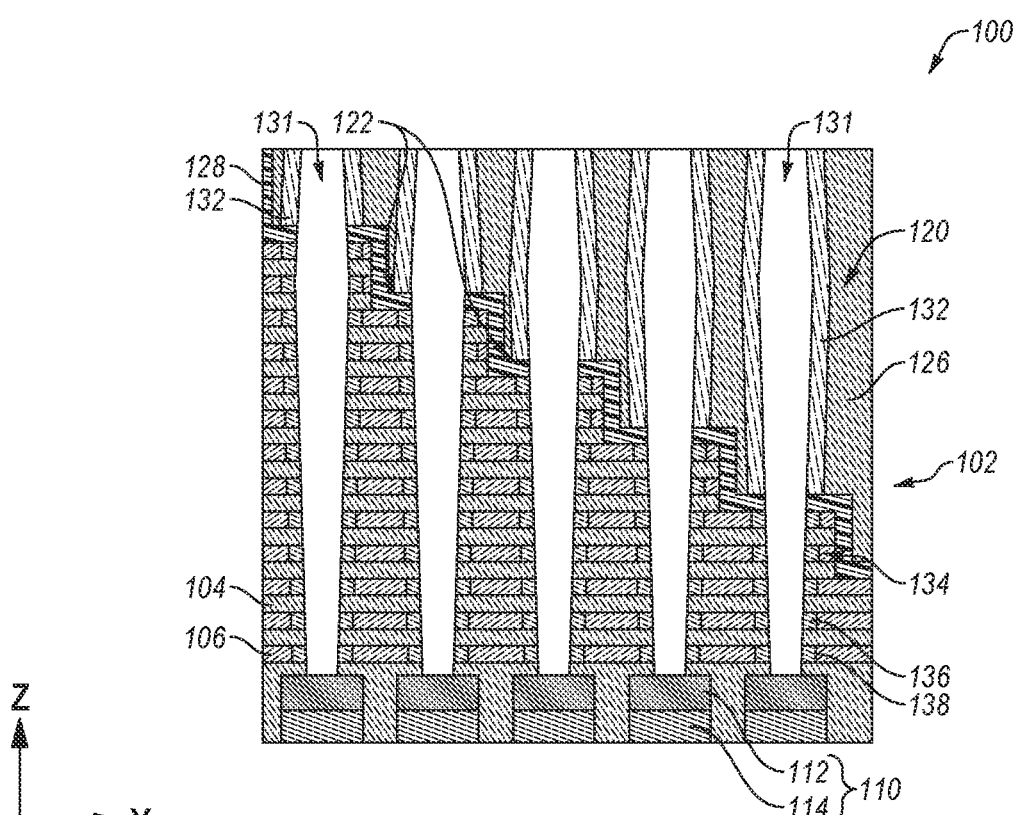
Figure 1F:
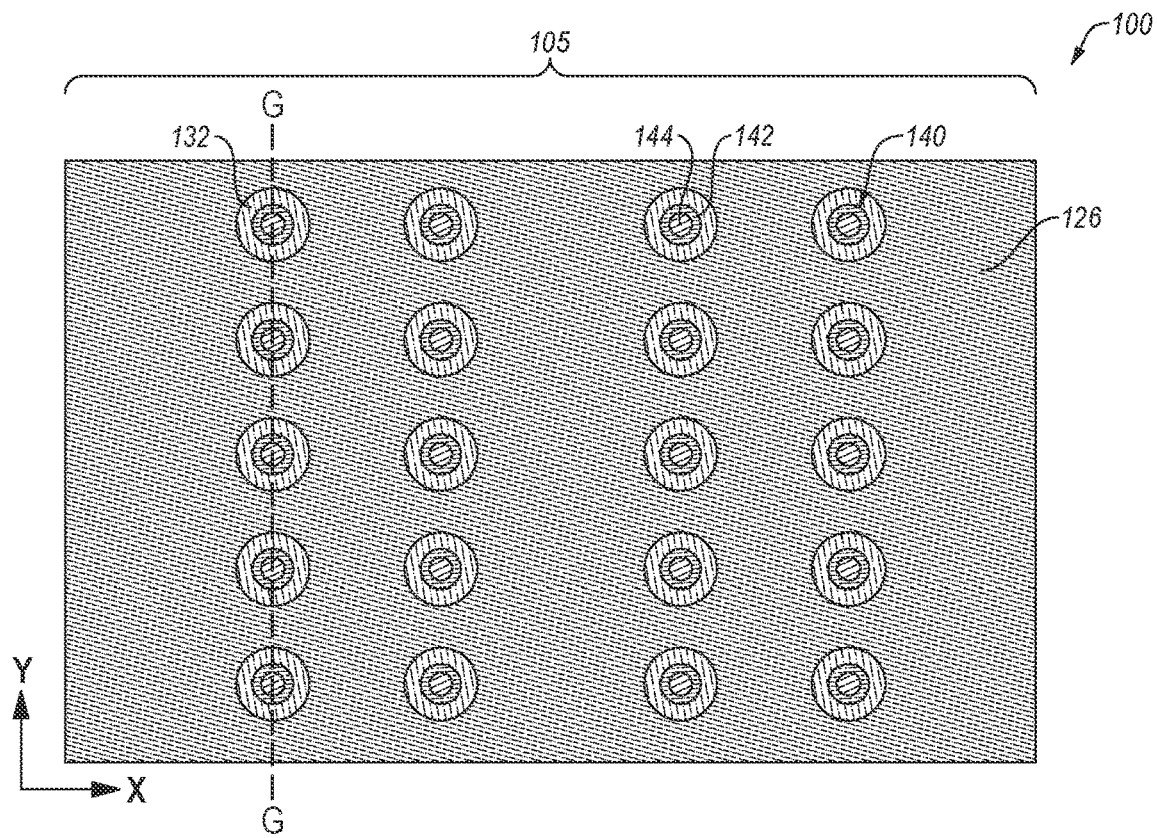
Figure 1G:
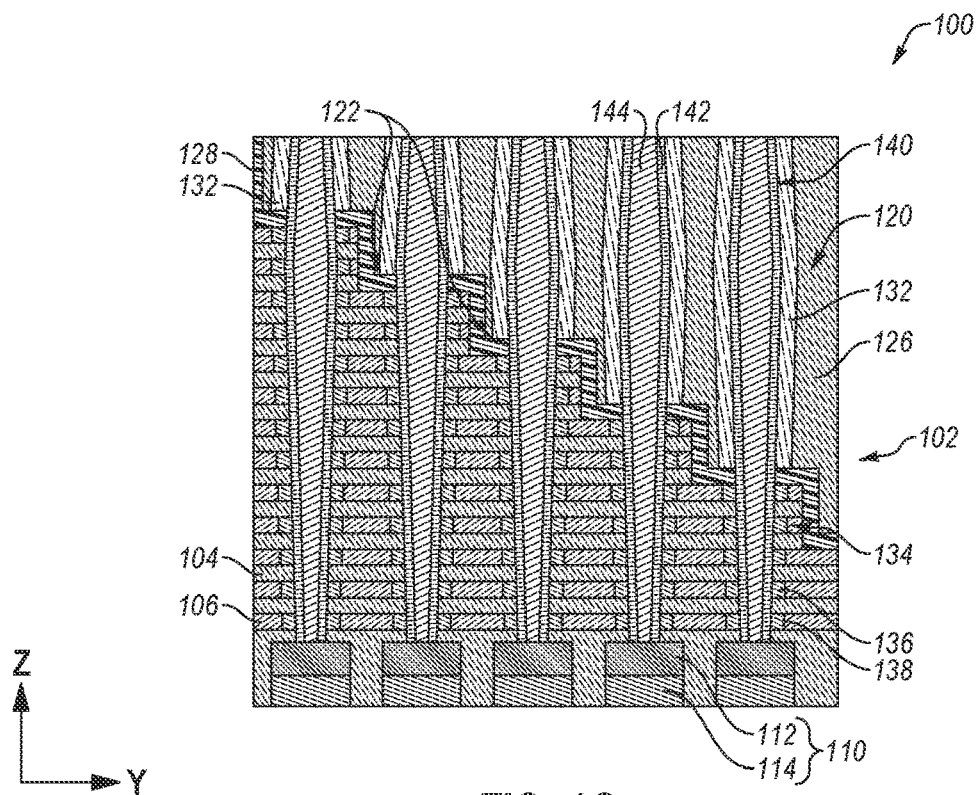
Figure 1H:
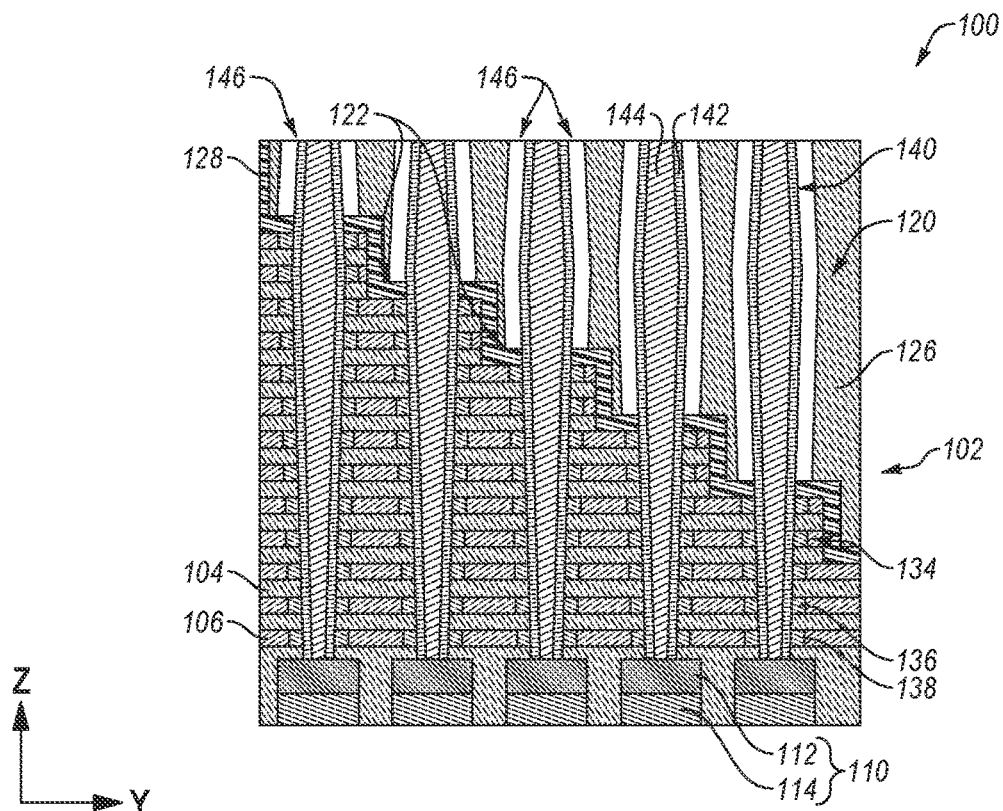
Figure 1I:
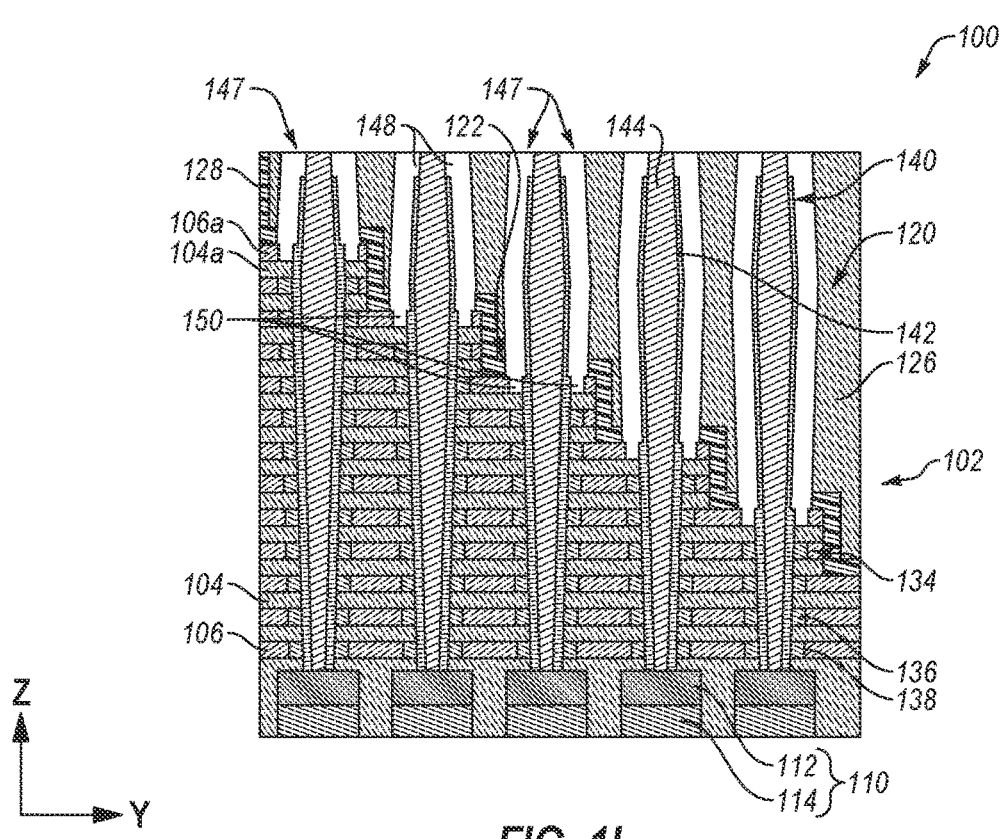
Figure 1J:
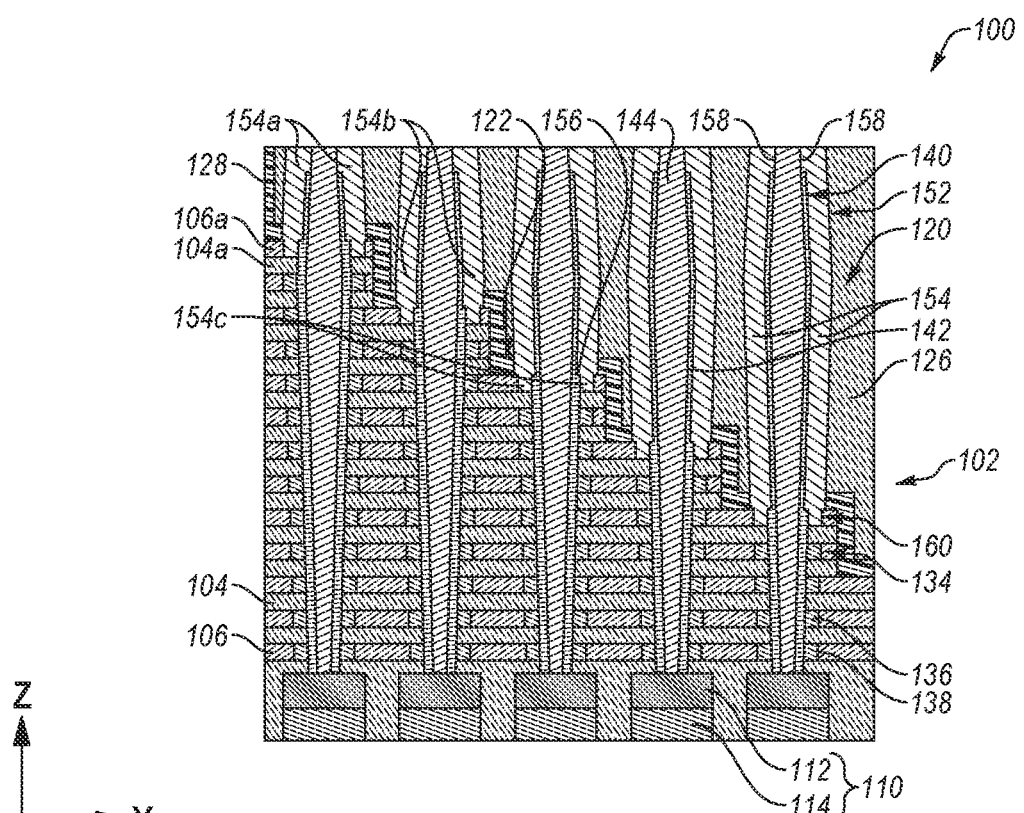
Figure 1K:
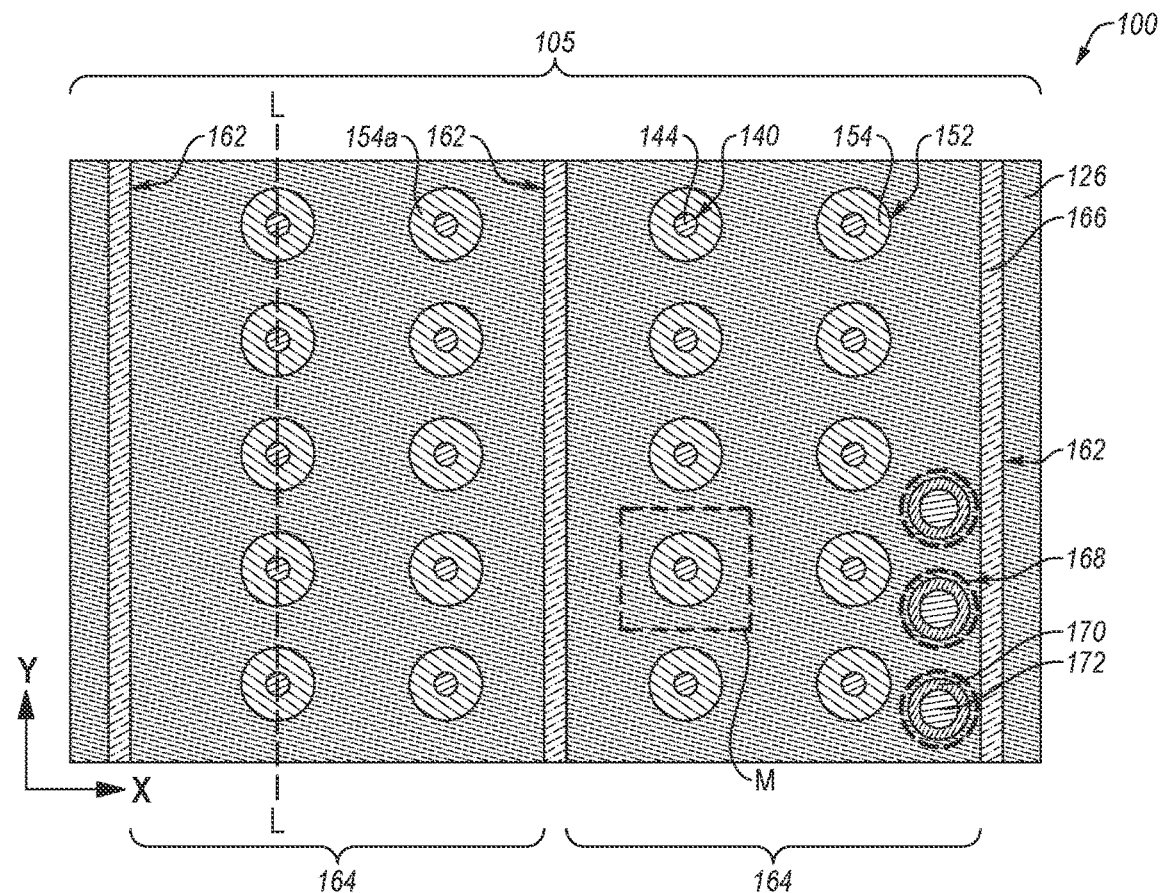
Figure 1L:
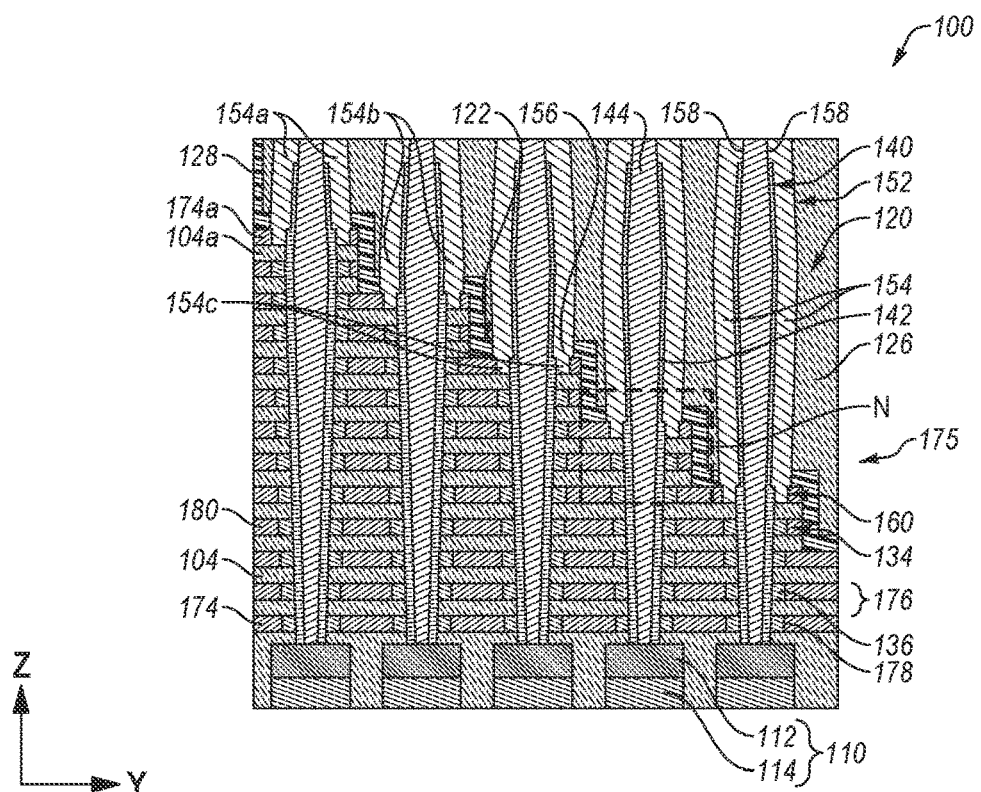
Figure 1M:
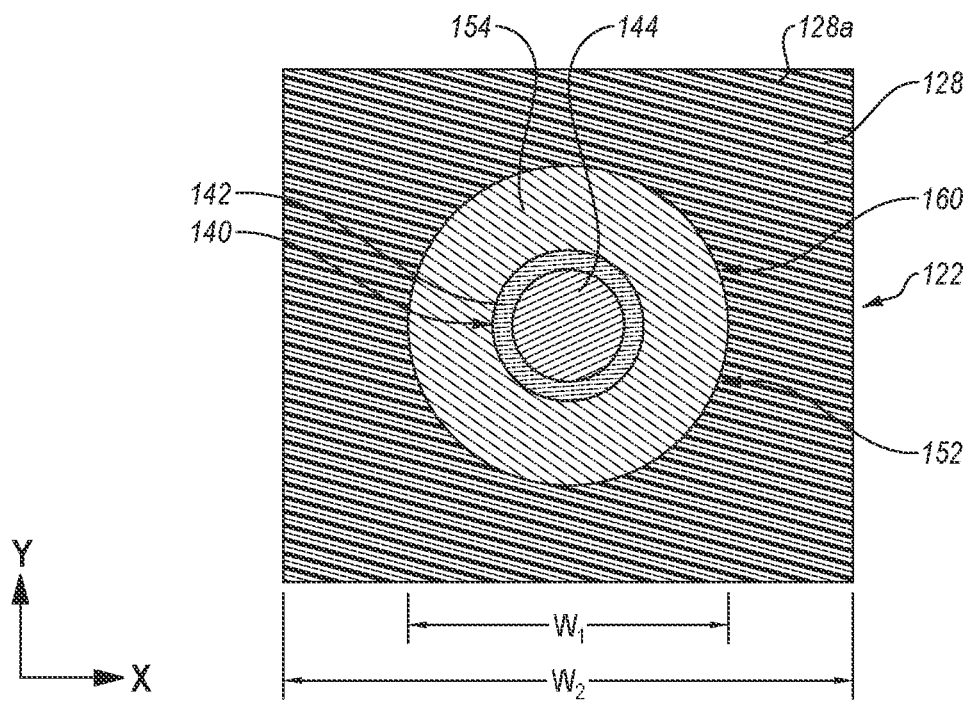
Figure 1N:
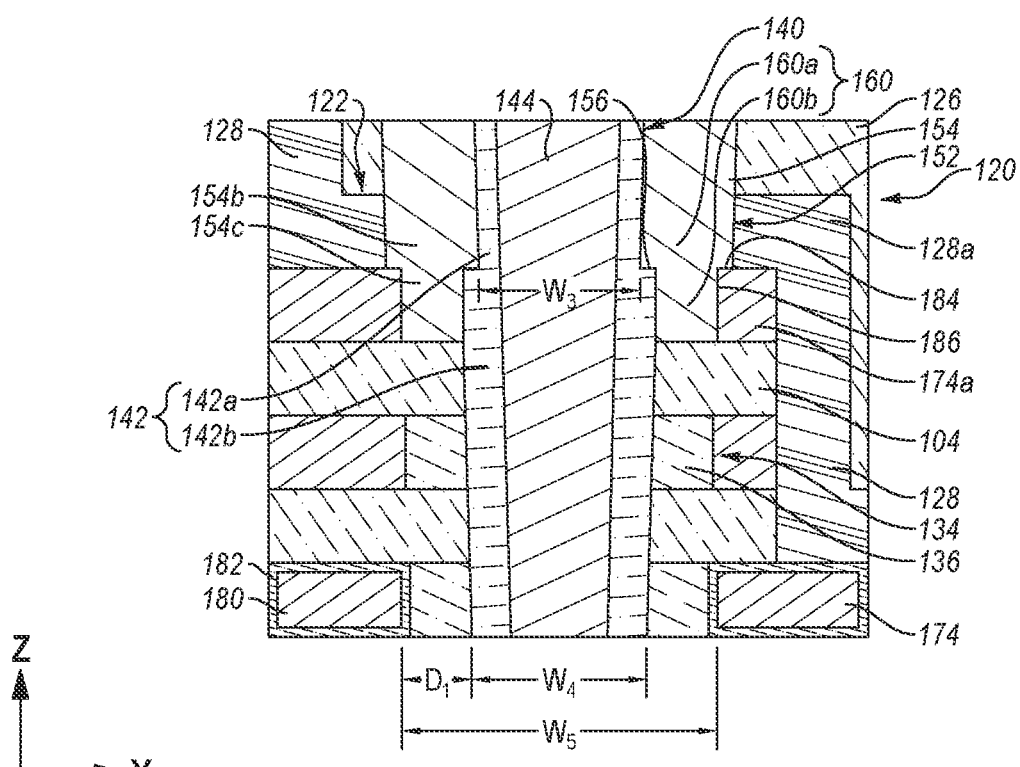

FIGS. 1A through 1N are simplified, partial top-down views (FIGS. 1A, 1F, and 1K) and simplified, partial cross-sectional views (FIGS. 1B through 1E, 1G through 1J, and 1L through 1N) illustrating different processing stages of a method of forming a microelectronic device (e.g., a memory device, such as a three-dimensional (3D) NAND Flash memory device), in accordance with embodiments of the disclosure. FIG. 1M illustrates an enlarged portion of the top-down view of box M of FIG. 1K, and FIG. 1N illustrates an enlarged portion of the cross-sectional view of box N of FIG. 1L. With the description provided below, it will be readily apparent to one of ordinary skill in the art that the methods and structures described herein with reference to FIGS. 1A through 1N may be used in the formation and configuration of various devices and electronic systems. In other words, the methods of the disclosure may be used whenever it is desired to form a microelectronic device. For convenience in describing FIGS. 1A through 1N, a first horizontal direction may be defined as the X-direction shown in some of FIGS. 1A through 1N; a second horizontal direction transverse (e.g., orthogonal, perpendicular) to the first horizontal direction may be defined as the Y-direction shown in some of FIGS. 1A through 1N; and a third direction (e.g., a vertical direction) transverse (e.g., orthogonal, perpendicular) to each of the first horizontal direction and the second horizontal direction may be defined the Z-direction shown in some of FIGS. 1A through 1N. Similar directions are shown in FIGS. 2A through 2F and FIG. 3, which are discussed in further detail below.

With reference to FIG. 1A, a microelectronic device structure 100 may be formed to include a preliminary stack structure 102 (FIG. 1B). A dielectric material 116 may, optionally, be formed to vertically overlie (e.g., in the Z-direction) the preliminary stack structure 102. The microelectronic device structure 100 may include a staircase region 105 including at least one staircase structure 120 (FIG. 1B). The microelectronic device structure 100 may also include an array region horizontally (e.g., in the X-direction) neighboring the staircase region 105. For example, the array region may include memory pillar structures (e.g., cell pillar structures) employed as memory cells (e.g., strings of NAND memory cells), as described in further detail with reference to FIG. 3. While not illustrated in FIGS. 1A through 1N, features of the array region of the microelectronic device structure 100 may be formed during (e.g., substantially simultaneous with) formation of corresponding features of the staircase region 105. Openings 130 may be formed to vertically extend (e.g., in the Z-direction) through one or more materials overlying the staircase structure 120 within the staircase region 105. The preliminary stack structure 102 of the staircase region 105 is described in further detail below, along with additional components (e.g., structures, features) of the microelectronic device structure 100 at the processing stage depicted in FIG. 1A. FIG. 1B is a simplified, partial cross-sectional view of the microelectronic device structure 100 about the line B-B shown in FIG. 1A. For clarity and ease of understanding of the drawings and related description, not all features depicted in one of FIGS. 1A and 1B are depicted the other of FIGS. 1A and 1B.

Referring to FIG. 1B, the preliminary stack structure 102 may be formed to include a vertically alternating (e.g., in the Z-direction) sequence of insulative structures 104 and additional insulative structures 106 arranged in tiers 108. Each of the tiers 108 of the preliminary stack structure 102 may include at least one (1) of the insulative structures 104 vertically neighboring at least one (1) of the additional insulative structures 106. The insulative structures 104 may be interleaved with the additional insulative structures 106.

The insulative structures 104 of the preliminary stack structure 102 may be formed of and include at least one insulative material. In some embodiments, the insulative structures 104 are formed of and include silicon dioxide ($SiO_2$). Each of the insulative structures 104 may individually include a substantially homogeneous distribution or a substantially heterogeneous distribution of the at least one insulative material. The insulative structures 104 may each be substantially planar, and may each independently exhibit any desired thickness. In addition, each of the insulative structures 104 may be substantially the same (e.g., exhibit substantially the same material composition, material distribution, size, and shape) as one another, or at least one of the insulative structures 104 may be different (e.g., exhibit one or more of a different material composition, a different material distribution, a different size, and a different shape) than at least one other of the insulative structures 104. In some embodiments, each of the insulative structures 104 is substantially the same as each other of the insulative structures 104.

The additional insulative structures 106 may be formed of and include at least one additional insulative material that is different than, and that exhibits etch selectivity with respect to, the insulative material of the insulative structures 104. For example, the additional insulative structures 106 may individually be formed of and include at least one dielectric nitride material (e.g., SiN g) and/or at least one oxynitride material (e.g., $SiO_xN_y$). In some embodiments, the additional insulative structures 106 are formed of and include $Si_3N_4$. Each of the additional insulative structures 106 may individually include a substantially homogeneous distribution or a substantially heterogeneous distribution of the at least one additional insulative material. The additional insulative structures 106 may serve as sacrificial structures for the subsequent formation of conductive structures, as described in further detail below.

Although FIG. 1B illustrates a particular quantity of tiers 108 of the insulative structures 104 and the additional insulative structures 106, the disclosure is not so limited. In some embodiments, the preliminary stack structure 102 includes a desired quantity of the tiers 108, such as within a range from thirty-two (32) of the tiers 108 to two hundred fifty-six (256) of the tiers 108. In some embodiments, the preliminary stack structure 102 includes sixty-four (64) of the tiers 108. In other embodiments, the preliminary stack structure 102 includes a different quantity of the tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108, greater than two hundred fifty-six (256) of the tiers 108) of the insulative structures 104 and the additional insulative structures 106. In addition, in some embodiments, the preliminary stack structure 102 overlies a deck structure comprising additional tiers 108 of insulative structures 104 and the additional insulative structures, separated from the preliminary stack structure 102 by at least one dielectric material, such as an interdeck insulative material.

With continued reference to FIG. 1B, the microelectronic device structure 100 further includes a source tier 110 vertically underlying (e.g., in the Z-direction) the preliminary stack structure 102. The source tier 110 may comprise, for example, a first conductive material 112 and a second conductive material 114. In some embodiments, the first conductive material 112 comprises conductively doped silicon. In some such embodiments, the second conductive material 114 is formed of and includes one or more of a metal silicide material (e.g., tungsten silicide ($WSi_x$)), a metal nitride material (e.g., tungsten nitride), and a metal silicon nitride material (e.g., tungsten silicon nitride ($WSi_xN_y$)). In some embodiments, the second conductive material 114 comprises tungsten silicide.

The dielectric material 116, which may serve as a mask material, may vertically overlie (e.g., in the Z-direction) a vertically uppermost tier 108 of the insulative structures 104 and the additional insulative structures 106 of the preliminary stack structure 102. The dielectric material 116 may comprise one or more of the materials described above with reference to the insulative structures 104. In some embodiments, the dielectric material 116 comprises silicon dioxide.

In some embodiments, the source tier 110 is formed to include one or more source structures 118 (e.g., a source plate, source lines) horizontally extending into a horizontal area of the staircase region 105. The source structure(s) 118 may be operatively associated with vertically extending strings of memory cells within a memory array region of the microelectronic device structure 100, as described in further detail below. The source structure(s) 118 may be formed of and include the first conductive material 112 and the second conductive material 114, and may be electrically isolated from other portions of the first conductive material 112 and the second conductive material 114 (e.g., other portions employed as conductive routing structures 117 and/or as conductive pad structures) by insulative material 119.

As shown in FIG. 1B, the staircase structure 120 may be formed within the staircase region 105 of the preliminary stack structure 102. A dielectric fill material 126 may be formed to fill at least one valley 124 (e.g., space, gap, trench, opening) vertically overlying the staircase structure 120. In some embodiments, one or more insulative liner materials are formed to vertically overlie (e.g., in the Z-direction) the staircase structure 120 prior to forming the dielectric fill material 126, as described in greater detail below.

The dielectric fill material 126 may be formed of and include at least one material exhibiting etch selectivity with respect to one or more of the dielectric material 116, the insulative structures 104, the additional insulative structures 106, as well as additional materials (e.g., additional insulative materials, additional conductive materials) formed during subsequent processing of the microelectronic device structure 100. In some embodiments, the dielectric fill material 126 comprises at least one insulative material, such as one or more of the materials described above with reference to the insulative structures 104 (e.g., $SiO_2$). The dielectric fill material 126 may, alternatively, be formed of and include one or more of silicon oxycarbide ($SiO_xC_y$), silicon oxynitride ($SiO_xN_y$), hydrogenated silicon oxycarbide ($SiC_xO_yH_z$), or silicon oxycarbonitride ($SiO_xC_yN_z$), for example.

The staircase structure 120 may be formed to include steps 122 comprising edges (e.g., horizontal ends) of the tiers 108 of the insulative structures 104 and additional insulative structures 106. For example, individual steps 122 may include an uppermost insulative structure 104a and an uppermost additional insulative structure 106a overlying the uppermost insulative structure 104a such that the uppermost additional insulative structure 106a is proximate (e.g., directly adjacent) to the dielectric fill material 126. Although FIG. 1B illustrates two (2) of the tiers 108 of the insulative structures 104 and the additional insulative structures 106 corresponding to one (1) step 122 of the staircase structure 120, the quantity of steps 122 of the staircase structure 120 may correspond to the quantity of tiers 108, such that a single (e.g., only one) step 122 corresponds to one of the tiers 108. The staircase structure 120 (and the valley 124 at least partially defined by the staircase structure 120) include a stepped cross-sectional profile in the ZY-plane, as shown in FIG. 1B. The stepped cross-sectional profile of the staircase structure 120 (and of the valley 124) may be defined by the geometric configurations of the steps 122 of the staircase structure 120.

For clarity and ease of understanding the description, FIG. 1B illustrates only a particular quantity of steps 122 in the staircase structure 120. However, it will be understood that the staircase structure 120 may include a greater quantity of steps 122 than those illustrated. For example, the staircase structure 120 may include greater or equal to eight (8) of the steps 122, greater than or equal to sixteen (16) of the steps 122, greater or equal to than thirty-two (32) of the steps 122, greater than or equal to sixty-four (64) of the steps 122, greater than or equal to one hundred twenty-eight (128) of the steps 122, or greater than or equal to two hundred fifty-six (256) of the steps 122.

In some embodiments, the staircase structure 120 forms a portion of a stadium structure including opposing staircase structures 120 each having steps 122 defined by horizontal ends of the tiers 108 of the preliminary stack structure 102. In some such embodiments, multiple (e.g., more than one) stadium structures individually including one or more initial staircase structures may be formed to be positioned at substantially the same elevations (e.g., vertical locations) as one another within the preliminary stack structure 102. During formation of the steps 122 of the staircase structure 120, an initial staircase structure (e.g., configured substantially similar to the staircase structure 120) may be formed at an upper vertical position within the preliminary stack structure 102 within horizontal boundaries of the staircase region 105 of the microelectronic device structure 100 using conventional processes (e.g., conventional photolithographic patterning processes, conventional material removal processes), and conventional processing equipment, which are not described in detail herein. The microelectronic device structure 100 may then be subjected to one or more additional material removal processes (e.g., one or more chopping processes) to increase the depth(s) (e.g., in the Z-direction) of the initial staircase structure relative to an upper surface of the preliminary stack structure 102 and form the staircase structure 120. The staircase structure 120 may be substantially similar to the initial staircase structure used to form the staircase structure 120, except located at a relatively lower vertical position within the microelectronic device structure 100 (e.g., within the preliminary stack structure 102). The additional material removal processes may permit a lower boundary of the staircase structure 120 to be positioned at or below a lower boundary of the preliminary stack structure 102.

Still referring to FIG. 1B, following formation of the staircase structure 120, the openings 130 (e.g., initial contact openings) may be formed to vertically extend (e.g., in the Z-direction) through the dielectric material 116, if present, and through the dielectric fill material 126 overlying the staircase structure 120 within the staircase region 105. The openings 130 may be formed to extend to upper boundaries of the staircase structure 120 on at least some (e.g., each) of the steps 122, without extending through the preliminary stack structure 102. At least portions of the dielectric material 116 and the dielectric fill material 126 may be removed by exposing the respective materials to wet etch chemistries and/or dry etch chemistries, for example, in one or more material removal processes. The uppermost additional insulative structure 106a may act as an etch stop material during removal of the dielectric fill material 126 and formation of the openings 130.

In some such embodiments, the openings 130 terminate at the steps 122 of the staircase structure 120 at the processing stage depicted in FIG. 1B. In other embodiments, the openings 130 terminate at or within one or more insulative liner materials overlying the staircase structure 120, as described in greater detail with reference to FIG. 1D. Accordingly, the openings 130 may be formed to extend to varying (e.g., differing) depths corresponding to various locations of the individual steps 122 of the staircase structure 120. A horizontal dimension (e.g., width) of each of the openings 130 may be relatively less than that of upper surfaces (e.g., treads) of the steps 122 of the staircase structure 120. For example, a width of the openings 130 may be within a range of from about 150 nanometers (nm) to about 500 nm, such as from about 150 nm to about 250 nm, from about 250 nm to about 350 nm, or from about 350 nm to about 500 nm. However, the disclosure is not so limited and the width of the openings 130 may be different than those described above. In some embodiments, the width of the openings 130 may be selected and tailored to effect a size and shape of one or more features to be formed in the microelectronic device structure 100, as will be described herein. Additional portions of the dielectric fill material 126 may remain on the upper surfaces of the steps 122 of the staircase structure 120 following formation of the openings 130.

Referring next to FIG. 1C, sacrificial material 132 may be formed within the openings 130. The sacrificial material 132 may be formed using one or more conformal deposition processes, such as one or more of a conventional conformal CVD process or a conventional ALD process. Since the sacrificial material 132 is conformally formed, a portion of the openings 130 within the dielectric fill material 126 may remain substantially free of the sacrificial material 132. Accordingly, the sacrificial material 132 is formed in the openings 130 without fully filling the openings 130. The sacrificial material 132 may have a thickness within a range of from about 50 nm to about 150 nm, such as from about 50 nm to about 75 nm, from about 75 nm to about 125 nm, or from about 125 nm to about 150 nm. However, the disclosure is not so limited and the thickness of the sacrificial material 132 may be different than those described above. In some embodiments, the thickness of the sacrificial material 132 represents less than about one-half (e.g., less than about one-third) of the width of the openings 130. The thickness of the sacrificial material 132 may be tailored to facilitate dimensions (e.g., widths) of additional materials to be formed within central portions of the openings 130 and within regions vacated by the sacrificial material 132.

The sacrificial material 132 may be formed adjacent to (e.g., directly adjacent to) exposed surfaces (e.g., side surfaces) of the dielectric material 116, if present, and the dielectric fill material 126 and adjacent to (e.g., directly adjacent to) exposed surfaces (e.g., upper surfaces) of the steps 122 of the staircase structure 120. For example, the sacrificial material 132 may terminate at the uppermost additional insulative structure 106a (FIG. 1B) of the individual steps 122. In some embodiments, a so-called "punch through" etch is then performed to remove portions of the sacrificial material 132 and expose the underlying portions of the uppermost additional insulative structure 106a of the individual steps 122. Accordingly, the sacrificial material 132 may be formed to extend from an upper surface of the dielectric material 116 to the steps 122 of the staircase structure 120. After forming the sacrificial material 132, the microelectronic device structure 100 may be exposed to a chemical mechanical planarization (CMP) process to remove sacrificial material outside of the boundaries of the openings 130.

The sacrificial material 132 may be formed of and include at least one material exhibiting etch selectivity with respect to each of the dielectric material 116, the dielectric fill material 126, the additional insulative structures 106, and the insulative structures 104, as well as additional materials (e.g., additional insulative materials, additional conductive materials) formed during subsequent processing of the microelectronic device structure 100. In some embodiments, the sacrificial material 132 comprises conductive material. By way of non-limiting example, the sacrificial material 132 may be formed of and include one or more of polysilicon, tungsten, titanium, titanium nitride, aluminum oxide, and another material. In some embodiments, the sacrificial material 132 comprises amorphous silicon or polycrystalline silicon. In some such embodiments, the sacrificial material 132 may be doped with one or more dopants, such as with at least one N-type dopant (e.g., one or more of arsenic, phosphorous, antimony, and bismuth) or at least one P-type dopant (e.g., one or more of boron, aluminum, and gallium). In other embodiments, the sacrificial material 132 comprises tungsten. The sacrificial material 132 may, alternatively, be formed of and include one or more of silicon oxycarbide ($SiO_xC_y$), silicon oxynitride ($SiO_xN_y$), hydrogenated silicon oxycarbide ($SiC_xO_yH_z$), or silicon oxycarbonitride ($SiO_xC_yN_z$), for example. In some embodiments, the sacrificial material 132 is formed of and includes a carbon-containing material.

For clarity and ease of understanding the disclosure, the dielectric material 116 is not shown throughout the remaining description and the accompanying figures, but it is understood that the microelectronic device structure 100 may, optionally, include the dielectric material 116.

Referring to FIG. 1D, prior to formation of the dielectric fill material 126, an insulative liner material 128 may, optionally, be formed to vertically overlie (e.g., in the Z-direction) the staircase structure 120, the vertically uppermost tier 108 of the insulative structures 104, and the additional insulative structures 106. For convenience, the insulative liner material 128 is absent in previous views of the drawings, although it is understood that the insulative liner material 128 may be present in embodiments of the disclosure at the processing stages of FIGS. 1A through 1C. If present, the insulative liner material 128 may be formed to vertically overlie (e.g., in the Z-direction) the staircase structure 120.

As shown in FIG. 1D, the insulative liner material 128 may include upper portions 128a and side portions 128b proximate to and intervening between neighboring portions of the upper portions 128a. For example, the upper portions 128a may horizontally extend across (e.g., in the Y-direction) and substantially cover upper surfaces of the steps 122, and the side portions 128b may vertically extend across (e.g., in the Z-direction) and substantially cover side surfaces of the steps 122. The insulative liner material 128 may be formed to include a substantially continuous material (e.g., a substantially continuous liner material) on or over the steps 122 of the staircase structure 120. The upper portion 128a of the insulative liner material 128 may be formed to include a sacrificial portion (e.g., a central portion) formulated to be removed during formation of openings (e.g., the openings 130 (FIG. 1C)) and a remaining portion designated to remain on or over the steps 122 of the staircase structure 120. The remaining portion of the upper portions 128a of the insulative liner material 128 may be located horizontally proximate to and at least partially surrounding the sacrificial portion thereof. In some embodiments, the sacrificial material 132 extends to an upper surface of the insulative liner material 128, as shown in FIG. 1D. The insulative liner material 128 may act as an etch stop material during removal of the dielectric fill material 126 and formation of the openings 130. In other embodiments, the openings 130 and, thus, the sacrificial material 132 are formed to extend through the insulative liner material 128 such that portions of the sacrificial material 132 are laterally adjacent to the insulative liner material 128.

The insulative liner material 128 may exhibit etch selectivity relative to the dielectric material 116, the dielectric fill material 126, and the sacrificial material 132. In some embodiments, the insulative liner material 128 is formed of and includes at least one insulative material, such as one or more of the materials described above with reference to the insulative structures 104 (e.g., $SiO_2$). In other embodiments, the insulative liner material 128 may be formed of and include one or more of the materials described above with reference to the additional insulative structures 106 (e.g., $Si_3N_4$). The insulative liner material 128 may, alternatively, be formed of and include one or more of silicon oxycarbide ($SiO_xC_y$), silicon oxynitride ($SiO_xN_y$), hydrogenated silicon oxycarbide ($SiC_xO_yH_z$), or silicon oxycarbonitride ($SiO_xC_yN_z$), for example.

With continued reference to FIG. 1D, following formation of the sacrificial material 132, extended openings 131 (e.g., extended contact openings) may be formed to vertically extend (e.g., in the Z-direction) through the dielectric fill material 126, the insulative liner material 128, if present, and the preliminary stack structure 102, such as through tiers 108 of the insulative structures 104 and the additional insulative structures 106 within the staircase region 105. For example, the extended openings 131 may vertically extend from a vertically uppermost boundary of the dielectric fill material 126 to or beyond a vertically uppermost boundary of the first conductive material 112 of the source tier 110, without terminating on the steps 122 of the staircase structure 120. The extended openings 131 may be formed to be self-aligned with the openings 130. Accordingly, the extended openings 131 may be formed within horizontal areas of the openings 130 (FIG. 1C) and extend below a lower boundary of the sacrificial material 132.

At least portions of each of the insulative liner material 128, the insulative structures 104, and the additional insulative structures 106 are removed by exposing the respective materials to wet etch chemistries and/or dry etch chemistries, for example, in one or more material removal processes. Portions of the initial material of the insulative liner material 128 (e.g., the central portions) may be removed (e.g., etched) in one or more material removal processes resulting in a horizontal dimension (e.g., width) of each of the extended openings 131 being relatively less than that of the upper portions 128a of the insulative liner material 128 (e.g., corresponding to upper surfaces of the steps 122 of the staircase structure 120). Additional portions of the upper portions 128a of the insulative liner material 128 may remain on the upper surfaces of the steps 122 of the staircase structure 120 following formation of the extended openings 131.

As shown in FIG. 1D, the extended openings 131 extend beyond the upper surfaces of the steps 122 of the staircase structure 120 and through the materials of the preliminary stack structure 102. Accordingly, the extended openings 131 may be formed to extend from an upper surface of the dielectric fill material 126 to the source tier 110 underlying the preliminary stack structure 102. In other words, the extended openings 131 extend entirely through a vertical extent (e.g., a height) of the preliminary stack structure 102. Thus, a height of each of the extended openings 131 in the vertical direction (e.g., the Z-direction) may be substantially similar to (e.g., substantially the same as) one another irrespective of horizontal orientation relative to the steps 122 of the staircase structure 120.

The first conductive material 112 of the source tier 110 may act as an etch stop material during removal of each of the dielectric fill material 126, the insulative liner material 128, the insulative structures 104, and the additional insulative structures 106, and formation of the extended openings 131. In some such embodiments, the extended openings 131 terminate within the source tier 110, such as at or within the first conductive material 112 at the processing stage depicted in FIG. 1D. In other embodiments, the extended openings 131 terminate at or within an insulative material overlying the first conductive material 112. In additional embodiments, the extended openings 131 extend through the first conductive material 112 and terminate at or within the second conductive material 114. As will be described herein, the extended openings 131 may be used to form conductive contacts (e.g., conductive contacts 140 (FIGS. 1F and 1G)) in contact with conductive contact structures (e.g., strapping structures 160 (FIG. 1J)) of the staircase structure 120.

Referring to FIG. 1E, prior to forming materials of the conductive contacts 140 (FIG. 1G) within the extended openings 131, lateral (e.g., in the X-direction, in the Y-direction) portions of the additional insulative structures 106 may be converted to another insulative material to isolate the additional insulative structures 106 from the materials of the conductive contacts 140. For example, an initial material (e.g., a silicon nitride material of the additional insulative structures 106) may be oxidized to form a liner material 136 (e.g., an inner liner material, an inner insulative material). Accordingly, the liner material 136 may be directly laterally adjacent to (e.g., continuous with) remaining portions of the additional insulative structures 106. In some such embodiments, the liner material 136 is formed of and includes an oxide material having a material composition that differs from that of the remaining portions of the additional insulative structures 106, although other materials of the liner material 136 may be contemplated, so long as the liner material 136 exhibits etch selectivity relative to surrounding materials.

Formation of the liner material 136 within the recessed regions may result in formation of isolation regions 134 between the extended openings 131 and the remaining portions of the additional insulative structures 106, such that portions of the additional insulative structures 106 having a first material composition are remote (e.g., isolated) from the extended openings 131 by the liner material 136 of the isolation regions 134 having a second, different material composition. Stated another way, process acts may be selected to provide (e.g., facilitate, promote) formation of the liner material 136 proximate the extended openings 131 for formation of the isolation regions 134 between the remaining portions of the horizontally neighboring additional insulative structures 106 and subsequently formed materials of the conductive contacts 140 (FIG. 1G) within the extended openings 131.

Alternatively, the lateral portions of the additional insulative structures 106 may be selectively removed through the extended openings 131 to form recessed regions for formation of the isolation regions 134. By way of non-limiting example, exposed portions of the additional insulative structures 106 may be exposed to an etchant (e.g., a wet etchant) through the extended openings 131 to selectively remove portions of the additional insulative structures 106 with respect to the insulative structures 104. In some embodiments, the additional insulative structures 106 are exposed to phosphoric acid ($H_3PO_4$) to selectively remove portions of the additional insulative structures 106 proximate the extended openings 131.

After selectively removing portions of the additional insulative structures 106, the liner material 136 may be formed within the recessed regions proximate remaining portions of the additional insulative structures 106 without fully filling the extended openings 131. For example, the liner material 136 may be formed within the recessed regions to effectively "pinch off" and close (e.g., seal) the recessed regions immediately adjacent to the extended openings 131. The liner material 136 may be formed to extend between vertically neighboring insulative structures 104 proximate the recessed regions vacated by portions of the additional insulative structures 106 such that the liner material 136 substantially vertically fills portions of the recessed regions proximate the extended openings 131 without entirely filling the extended openings 131. The liner material 136 is formed by conventional techniques, such as one or more of in situ growth, CVD, ALD, and PVD using conventional processing equipment. In some embodiments, the liner material 136 may be formed (e.g., deposited) using a single, continuous ALD process or a single, continuous CVD process.

The liner material 136 may be formed of and include one or more of the materials described above with reference to the insulative structures 104 ($SiO_2$). For example, the liner material 136 may be formed of and include at least one insulative material that is different than, and that exhibits etch selectivity with respect to, one or more of the additional insulative structures 106 and the insulative liner material 128. In some embodiments, the liner material 136 is formed of and includes a single high-quality silicon oxide material, such as an ALD $SiO_x$. For example, the liner material 136 may be a highly uniform and highly conformal silicon oxide material (e.g., a highly uniform and highly conformal silicon dioxide material) so that substantially no voids are present in the liner material 136. The liner material 136 may, alternatively, be formed of and include one or more of silicon oxycarbide ($SiO_x C_y$), silicon oxynitride ($SiO_xN_y$), hydrogenated silicon oxycarbide ($SiC_xO_yH_z$), or silicon oxycarbonitride ($SiO_xC_yN_z$), for example.

As shown in FIG. 1E, one or more side surfaces (e.g., lateral side surfaces, horizontal side surfaces) of the isolation regions 134 may directly contact side surfaces of the remaining portions of the additional insulative structures 106 of the preliminary stack structure 102 along interfaces 138 (e.g., vertical interfaces). The sacrificial material 132 may exhibit a greater lateral extent (e.g., a width in the Y-direction) than a lateral extent of the isolation regions 134, as shown in FIG. 1E. In other words, the remaining portions of the additional insulative structures 106 may be adjacent to (e.g., underlying) the sacrificial material 132. In additional embodiments, side surfaces of the sacrificial material 132 are substantially aligned with side surfaces of the isolation regions 134 or, alternatively, the isolation regions 134 may exhibit a slightly greater lateral extent than a lateral extent of the sacrificial material 132, so long as remaining portions of the uppermost additional insulative structure 106a are accessible through subsequently formed openings proximate to the isolation regions 134.

Referring next to FIG. 1F, following formation of the isolation regions 134 (FIG. 1E), a liner material 142 (e.g., insulative material) and a fill material 144 (e.g., conductive material) may be formed within the extended openings 131 (FIG. 1E) to form the conductive contacts 140. Formation of the liner material 142 and the fill material 144 of the conductive contacts 140 is described in further detail below, along with additional components (e.g., structures, features) of the microelectronic device structure 100 at the processing stage depicted in FIG. 1F. FIG. 1G is a simplified, partial cross-sectional view of the microelectronic device structure 100 about the line G-G shown in FIG. 1F. For clarity and ease of understanding of the drawings and related description, not all features depicted in one of FIGS. 1F and 1G are depicted the other of FIGS. 1F and 1G.

As shown in FIG. 1F, in combination with FIG. 1G, the liner material 142 of the conductive contacts 140 may be formed (e.g., conformally formed) in the extended openings 131 (FIG. 1E). Accordingly, the liner material 142 is formed in the extended openings 131 without fully filling the extended openings 131. The liner material 142 may be continuous along a vertical dimension (e.g., a vertical height) of the dielectric fill material 126 and the preliminary stack structure 102. The liner material 142 may be formed of and include insulative material, such as a dielectric oxide material. For example, the material of the liner material 142 may include a silicon oxide material (e.g., relatively high-quality silicon oxide material, such as an ALD $SiO_x$). A material composition of the liner material 142 may be substantially the same as a material composition of the dielectric fill material 126, or the material composition of the liner material 142 may be different than the material composition of the dielectric fill material 126. Accordingly, the material of the liner material 142 may or may not exhibit etch selectivity with respect to the dielectric fill material 126. The liner material 142 may be formed by conventional techniques, such as by CVD or ALD. In some embodiments, the liner material 142 is formed by plasma-enhanced ALD (PEALD).

Portions (e.g., upper portions) of the liner material 142 of the conductive contacts 140 may be in contact with and substantially surrounded by the sacrificial material 132 above an elevational level of the staircase structure 120 at the processing stage of FIGS. 1F and 1G. Additional portions (e.g., lower portions) of the liner material 142 may be in contact with and substantially surrounded by the insulative liner material 128, the insulative structures 104, and the liner material 136 of the isolation regions 134 of the preliminary stack structure 102. The liner material 142 may also be in contact with the first conductive material 112 of the source tier 110. Accordingly, the liner material 142 may be formed to extend from the upper surface of the dielectric fill material 126 to the source tier 110 underlying the preliminary stack structure 102. The liner material 142 may terminate at or within the second conductive material 114 of the source tier 110. Alternatively, the liner material 142 may terminate at or within the first conductive material 112.

The liner material 142 of the conductive contacts 140 may have a thickness within a range of from about 10 nm to about 60 nm, such as from about 10 nm to about 20 nm, from about 20 nm to about 30 nm, from about 30 nm to about 40 nm, from about 40 nm to about 50 nm, or from about 50 nm to about 60 nm. In some embodiments, the thickness of the liner material 142 is about 40 nm. However, the disclosure is not so limited and the thickness of the liner material 142 may be different than those described above. The thickness of the liner material 142 may be tailored to facilitate isolation of the fill material 144 from additional materials (e.g., conductive materials) to be formed adjacent to the conductive contacts 140. For example, the thickness of the liner material 142 may be responsive to a magnitude of a bias voltage applied during use and operation of the microelectronic device structure 100.

The fill material 144 (e.g., conductive material) of the conductive contacts 140 may be formed adjacent to the liner material 142 within the extended openings 131 (FIG. 1E). For example, the fill material 144 may substantially fill a remainder of the extended openings 131 and be at least partially (e.g., substantially) laterally surrounded by the liner material 142. Accordingly, the conductive contacts 140 may be formed to extend from the upper surface of the dielectric fill material 126 to the source tier 110 underlying the preliminary stack structure 102. The conductive contacts 140 may terminate at or within the second conductive material 114 of the source tier 110. Alternatively, the conductive contacts 140 may terminate at or within the first conductive material 112. In such embodiments, the conductive contacts 140 are formed to be self-aligned with the underlying conductive materials (e.g., the first conductive material 112) using a so-called "assisted self-alignment" process.

The fill material 144 of the conductive contacts 140 may be formed of and include at least one conductive material. By way of non-limiting example, the fill material 144 may be formed of and include one or more of polysilicon, tungsten, titanium, titanium nitride, and another material. In some embodiments, the conductive material comprises polysilicon. In some such embodiments, the fill material 144 is doped with one or more dopants, such as with at least one N-type dopant (e.g., one or more of arsenic, phosphorous, antimony, and bismuth) or at least one P-type dopant (e.g., one or more of boron, aluminum, and gallium). In other embodiments, the fill material 144 comprises tungsten. After forming the conductive contacts 140, the microelectronic device structure 100 may be exposed to a chemical mechanical planarization (CMP) process to remove sacrificial material outside of the boundaries of the extended openings 131. Upper surfaces of each of the sacrificial material 132, the liner material 142, and the fill material 144 may be substantially coplanar with one another at the processing stage of FIGS. 1F and 1G.

Once formed, each of the conductive contacts 140 may vertically extend completely through the preliminary stack structure 102 without terminating on the steps 122 of the staircase structure 120, as shown in FIG. 1G. For example, the conductive contacts 140 may vertically extend (e.g., in the Z-direction) from a vertically uppermost boundary of the dielectric fill material 126 (e.g., at or above an elevational level of a vertically uppermost tier 108 of the preliminary stack structure 102) to or beyond a vertically uppermost boundary of the second conductive material 114 of the source tier 110. In some embodiments, the staircase structure 120 is substantially free of conductive contacts formed to terminate on the steps 122 thereof.

The conductive contacts 140 may individually exhibit a substantially circular horizontal cross-sectional shape, as shown in the top-down view of FIG. 1F. However, the disclosure is not so limited. As a non-limiting example, in additional embodiments, the conductive contacts 140 individually exhibit a substantially rectangular cross-sectional shape (e.g., a substantially square cross-sectional shape), or a different elongate cross-sectional shape (e.g., an oblong cross-sectional shape). At least some of the conductive contacts 140 may exhibit a different geometric configuration (e.g., one or more different dimensions, a different shape) and/or different horizontal spacing than at least some other of the conductive contacts 140, or each of the conductive contacts 140 may exhibit substantially the same geometric configuration (e.g., the same dimensions and the same shape) and horizontal spacing (e.g., in the X-direction) as each of the other conductive contacts 140. For example, individual conductive contacts 140 of the microelectronic device structure 100 may exhibit a height (e.g., in the Z-direction) that is substantially similar to a height of each other of the conductive contacts 140.

Accordingly, manufacturing processes may be simplified by forming the conductive contacts 140 to extend entirely through the vertical extent of the preliminary stack structure 102 and to terminate at a single location (e.g., at or within the source tier 110), without forming the conductive contacts 140 to extend to varying (e.g., differing) depths of individual steps 122 of the staircase structure 120. In contrast, conventional microelectronic device structures include conductive contacts that terminate (e.g., land on) upper surfaces of individual steps of staircase structures, resulting in varying heights of conductive contacts throughout the staircase structures. In some instances, damage may occur within the staircase structures during fabrication of conventional microelectronic device structures. Particularly, damage to the tier materials of the tiers, also called "clipping," may be a source of defect, which can adversely affect memory device performance.

In addition, misaligned conductive contacts that terminate on upper surfaces of the individual steps of staircase structures, may be susceptible to bridging (e.g., shorting, electrical connection) between neighboring portions of conductive structures (e.g., access lines). Further, terminating the conductive contacts at varying (e.g., differing) depths of the steps of the staircase structure of conventional microelectronic device structures may result in so-called "overetch" or "underetch" during processing. Accordingly, each of the conductive contacts 140 of the microelectronic device structure 100 may be formed to extend entirely through the vertical extent of the preliminary stack structure 102 and to terminate at the single location in order to substantially reduce (e.g., substantially prevent) damage within the staircase structure 120 during fabrication.

Referring to FIG. 1H, the sacrificial material 132 (FIG. 1G) may be removed (e.g., exhumed) to form second openings 146 vertically extending (e.g., in the Z-direction) through the dielectric fill material 126. The second openings 146 (e.g., initial second openings) may horizontally (e.g., in the X-direction, in the Y-direction) neighbor the liner material 142 of the conductive contacts 140 and the dielectric fill material 126 overlying the steps 122 of the staircase structure 120. To remove the sacrificial material 132, the microelectronic device structure 100 may be exposed to one or more etchants formulated and configured to selectively remove the sacrificial material 132 without substantially removing the dielectric fill material 126 and the liner material 142. By way of non-limiting example, the second openings 146 may be formed by exposing the sacrificial material 132 to a wet etchant, such as one or more of potassium hydroxide (KOH), sodium hydroxide (NaOH), tetramethylammonium hydroxide (TMAH), and another material. Prior to formation of the second openings 146, portions of the dielectric fill material 126 and the conductive contacts 140 may be covered with an additional dielectric material (e.g., an additional portion of the dielectric material 116 (FIG. 1C)) and/or an additional mask material configured and positioned to protect the dielectric fill material 126 and the materials of the conductive contacts 140 from being removed (e.g., exhumed) during the material removal processes of the sacrificial material 132.

The insulative liner material 128 or, alternatively, the uppermost additional insulative structure 106a may act as an etch stop material during removal of the sacrificial material 132 and formation of the second openings 146. For example, the second openings 146 may be formed to extend through the dielectric fill material 126 to expose upper surfaces of the insulative liner material 128, as shown in FIG. 1H. Alternatively, the second openings 146 may be formed to extend through each of the dielectric fill material 126 and the insulative liner material 128, such as when the sacrificial material 132 (FIG. 1G) is formed to extend laterally adjacent to the insulative liner material 128. Accordingly, the second openings 146 may terminate at or within the insulative liner material 128 or, alternatively, at or within the uppermost additional insulative structure 106a (FIG. 1B) including the liner material 136 of the isolation regions 134.

Referring to FIG. 1I, following formation of the second openings 146 (FIG. 1H), expanded openings 147 may be formed to vertically extend (e.g., in the Z-direction) through the dielectric fill material 126. By way of non-limiting example, following the formation of the second openings 146, the dielectric fill material 126 may be subjected to an etching process to expand (e.g., increase) horizontal dimensions of the second openings 146 vertically extending within the dielectric fill material 126. As will be described herein, the expanded openings 147 may be used to form structures (e.g., structures 152 (FIG. 1J)) including the conductive contact structures (e.g., the strapping structures 160 (FIG. 1J)) of the staircase structure 120.

The insulative liner material 128 or, alternatively, the uppermost additional insulative structure 106a may act as an etch stop material during removal of the dielectric fill material 126 and formation of the expanded openings 147. The expanded openings 147 may vertically extend from a vertically uppermost boundary of the dielectric fill material 126 to or beyond a vertically uppermost boundary of the insulative liner material 128 or, alternatively, to a vertically uppermost boundary of the uppermost additional insulative structure 106a. Accordingly, at least portions of the expanded openings 147 may extend through the insulative liner material 128.

In some embodiments, portions (e.g., lateral portions) of the liner material 142 of the conductive contacts 140 are selectively removed through the expanded openings 147. For example, upper portions of the liner material 142 may be selectively removed relative to lower portions thereof within the expanded openings 147, to recess the upper portions of the liner material 142 a lateral distance. Accordingly, a width of the upper portions of the liner material 142 above the staircase structure 120 (e.g., above upper surfaces of the uppermost additional insulative structure 106a of the individual steps 122 thereof) may be relatively less than a width of the lower portions of the liner material 142 within the staircase structure 120, as best shown in the enlarged view of FIG. 1N.

Portions of one or more of the dielectric fill material 126 and the liner material 142 are removed by exposing the respective materials to wet etch chemistries and/or dry etch chemistries, for example, in one or more material removal processes. By way of non-limiting example, portions of the dielectric fill material 126 and/or the liner material 142 may be exposed to hydrogen fluoride (HF), or to other halogen-based etch chemistries. However, the disclosure is not so limited and the dielectric fill material 126 and the liner material 142 may be removed by additional or alternative methods (e.g., by a buffered oxide etching (BOE) process). Thus, portions of one or more of the dielectric fill material 126 and the liner material 142 may be recessed to form the expanded openings 147. Recessing the dielectric fill material 126 and/or the liner material 142 increases the horizontal width of the second openings 146 (FIG. 1H), forming the expanded openings 147 adjacent to the dielectric fill material 126 and the liner material 142.

Additional portions (e.g., uppermost portions) of the liner material 142 may also be removed (e.g., exhumed) to form lateral openings 148 in communication with (e.g., continuous with) the expanded openings 147 and to expose side surfaces of the fill material 144. Further, portions of the liner material 136 of the isolation regions 134 of the uppermost additional insulative structure 106a may be removed (e.g., exhumed) to form vertical openings 150 in communication with the expanded openings 147 and to expose upper surfaces of the uppermost insulative structure 104a. The isolation regions 134 of the uppermost additional insulative structure 106a may be locations designated for the vertical openings 150. Accordingly, the vertical openings 150 are defined in at least one horizontal direction (e.g., the X-direction, the Y-direction) by the liner material 142 (e.g., the lower portions thereof) and the remaining portions of the uppermost additional insulative structure 106a at the processing stage of FIG. 1I.

The lateral openings 148 and the vertical openings 150 may be formed by, for example, forming and patterning one or more mask materials over the microelectronic device structure 100 and exposing the microelectronic device structure 100 to suitable etchants. For example, the lateral openings 148 may be formed in regions vacated by the uppermost portions of the liner material 142, and the vertical openings 150 may be formed in regions vacated by the liner material 136 of the isolation regions 134 of the uppermost additional insulative structure 106a following formation or, alternatively, during formation of the expanded openings 147.

The expanded openings 147 may exhibit a greater lateral extent (e.g., a width in the Y-direction) than a lateral extent of additional isolation regions 134 underlying the uppermost insulative structure 104a, as shown in FIG. 1I. In other words, the remaining portions of the additional insulative structures 106 may be adjacent to (e.g., underlying) the expanded openings 147. Since the vertical openings 150 are formed in regions vacated by the liner material 136 of the isolation regions 134, the expanded openings 147 may also exhibit a greater lateral extent than a lateral extent of the vertical openings 150. While FIG. 1I illustrates the expanded openings 147, as well as the lateral openings 148 and the vertical openings 150, being formed following formation of the second openings 146 (FIG. 1H) for clarity, the disclosure is not so limited, and one or more of the expanded openings 147, the lateral openings 148, and the vertical openings 150 may be formed during (e.g., substantially simultaneous with) formation of the second openings 146 to reduce cost and the number of process acts conducted.

Referring next to FIG. 1J, following formation of the expanded openings 147 (FIG. 1I), the lateral openings 148 (FIG. 1I), and the vertical openings 150 (FIG. 1I), conductive material 154 may be formed within each of the expanded openings 147, the lateral openings 148, and the vertical openings 150 to form the structures 152 (e.g., conductive contact structures, combined contact and support structures) adjacent to (e.g., directly laterally adjacent to) the liner material 142 of the conductive contacts 140. The structures 152 are defined by the conductive material 154 (also described herein as the strapping structures 160) and the materials (e.g., the liner material 142, the fill material 144) of the conductive contacts 140. The structures 152 may be configured as so-called "through array contacts."

Since the conductive contacts 140 are aligned within and substantially surrounded by the strapping structures 160, the structures may be characterized as "coaxial structures." As used herein, the term "coaxial" means and includes structures and features that share a common axis. For example, the conductive contacts 140 of the structures 152 share a common axis (e.g., a longitudinal axis) with the strapping structures 160 thereof. Accordingly, the structures 152 may be three-dimensional linear structures individually including an inner conductive core (e.g., the fill material 144 of the conductive contacts 140) vertically extending from an uppermost boundary of the preliminary stack structure 102 to conductive material (e.g., the second conductive material 114) of the source tier 110 underlying a lowermost boundary of the preliminary stack structure 102, an outer conductive shell (e.g., the conductive material 154 of the strapping structures 160) laterally surrounding portions of the inner conductive core, and the liner material 142 of the conductive contacts 140 separating the inner conductive core from the outer conductive shell.

The conductive material 154 of the structures 152 may be formed over exposed portions of the uppermost additional insulative structure 106a and may fill (e.g., substantially fill) the expanded openings 147 (FIG. 1I). Since the upper portions of the liner material 142 may be laterally recessed relative to the lower portions thereof, lower surfaces of the conductive material 154 may directly contact upper surfaces of the lower portions of the liner material 142 along interfaces 156 (e.g., horizontal interfaces). In addition, the conductive material 154 may be formed over uppermost surfaces of remaining portions of the liner material 142 and may fill (e.g., substantially fill) the lateral openings 148 (FIG. 1I).

Side surfaces (e.g., lateral side surfaces) of the conductive material 154 may be in direct physical contact with side surfaces of the fill material 144 along interfaces 158 (e.g., vertical interfaces). The conductive material 154 may be directly adjacent to and operably coupled (e.g., electrically connected) with the fill material 144. In some embodiments, the conductive material 154 of the structures 152 is integral and continuous with the fill material 144 of the conductive contacts 140 at an elevational level above the liner material 142. Thus, the strapping structures 160 are electrically coupled to upper portions of the fill material 144 of the conductive contacts 140 and isolated from lower portions of the fill material 144 thereof by the liner material 142. Further, the conductive material 154 may be formed over exposed portions of the uppermost insulative structure 104a and may fill (e.g., substantially fill) the vertical openings 150 (FIG. 1I). Accordingly, the conductive material 154 of individual structures 152 includes a first portion 154a within the lateral openings 148, a second portion 154b within the expanded openings 147, and a third portion 154c within the vertical openings 150. Upper surfaces of the strapping structures 160 (e.g., the conductive material 154 thereof) and the conductive contacts 140 (e.g., the fill material 144 thereof) may be substantially coplanar with one another.

As shown in FIG. 1J, the conductive material 154 may be continuous along a vertical dimension (e.g., a vertical height) of the expanded openings 147 (FIG. 1I), including the lateral openings 148 (FIG. 1I) and the vertical openings 150 (FIG. 1I). Accordingly, the conductive material 154 may be formed to extend from the upper surface of the dielectric fill material 126 to the uppermost insulative structure 104a of the preliminary stack structure 102, with portions of the conductive material 154 terminating at or within the uppermost insulative structure 104a and additional portions thereof terminating at or within the uppermost additional insulative structure 106a.

Portions (e.g., upper portions) of the fill material 144 of the conductive contacts 140 may be in contact (e.g., physical contact, electrical contact) with and substantially surrounded by the conductive material 154 (e.g., the first portion 154a), without the liner material 142 thereof intervening therebetween. In addition, portions of the liner material 142 may be in contact with and substantially surrounded by the conductive material 154 (e.g., the second portion 154b) above an elevational level of the uppermost additional insulative structure 106a of the preliminary stack structure 102, and additional portions of the liner material 142 may be in contact with and substantially surrounded by the conductive material 154 (e.g., the third portion 154c) laterally adjacent to the uppermost additional insulative structure 106a at the processing stage of FIG. 1J. The conductive material 154 (e.g., the first portion 154a thereof) directly intervenes between the fill material 144 and the dielectric fill material 126 overlying the staircase structure 120, the second portion 154b thereof directly intervenes between the upper portion of the liner material 142 and the dielectric fill material 126, and the third portion 154c thereof directly intervenes between the lower portion of the liner material 142 and the uppermost additional insulative structure 106a. Thus, the structures 152 include the liner material 142 of the conductive contacts 140 laterally intervening between a lower portion of the fill material 144 thereof and the conductive material 154, with an upper portion of the conductive material 154 overlying the liner material 142 and physically contacting the fill material 144. Stated another way, the strapping structures 160 substantially laterally surround upper portions of the conductive contacts 140 above an elevational level of the individual steps 122 of the staircase structure 120, without being laterally adjacent to the conductive contacts 140 within the preliminary stack structure 102.

The first portion 154a of the conductive material 154 may have a thickness (e.g., a height in the Z-direction) within a range of from about 10 nm to about 40 nm, such as from about 10 nm to about 20 nm, from about 20 nm to about 30 nm, or from about 30 nm to about 40 nm. However, the disclosure is not so limited and the thickness of the first portion 154a of the conductive material 154 may be different than those described above. In some embodiments, the thickness of the first portion 154a of the conductive material 154 substantially equal to a thickness (e.g., a height) of the additional insulative structures 106 of the preliminary stack structure 102, which reflects a thickness of subsequently formed conductive structures (e.g., access lines) within regions vacated by the additional insulative structures 106.

The conductive material 154 of the structures 152 may be formed of and include at least one conductive material. By way of non-limiting example, the conductive material 154 may be formed of and include one or more of polysilicon, tungsten, titanium, titanium nitride, and another material. In some embodiments, the conductive material comprises polysilicon. In some such embodiments, the conductive material 154 is doped with one or more dopants, such as with at least one N-type dopant (e.g., one or more of arsenic, phosphorous, antimony, and bismuth) or at least one P-type dopant (e.g., one or more of boron, aluminum, and gallium). In other embodiments, the conductive material 154 comprises tungsten. The conductive material 154 of the structures 152 and the fill material 144 of the conductive contacts 140 may or may not include substantially the same material composition as one another.

With continued reference to FIG. 1J, formation of the conductive material 154 results in formation of the strapping structures 160 (e.g., vertically projecting structures, horizontally projecting structures) of the staircase structure 120. The size and location of the strapping structures 160 may correspond to the size and location of the expanded openings 147 (FIG. 1I), the lateral openings 148, (FIG. 1I), and the vertical openings 150 (FIG. 1I). The strapping structures 160 may be considered portions of the structures 152 including the respective portions (e.g., the first portion 154a, the second portion 154b, the third portion 154c) of the conductive material 154 that, in turn, are operably coupled (e.g., electrically connected) to the fill material 144 of the conductive contacts 140. In other words, the strapping structures 160 provide electrical connection between the conductive contacts 140 and conductive structures (e.g., access lines, conductive structures 174 (FIG. 1L)), as will be described herein.

For example, as shown in FIG. 1J, the conductive contacts 140 of the structures 152 may individually include the fill material 144 in electrical communication with the source tier 110, such as with the second conductive material 114 thereof. In addition, the structures 152 may also individually include the conductive material 154, corresponding to one of the strapping structures 160, in electrical communication with the fill material 144 and adjacent to (e.g., laterally adjacent to, vertically adjacent to) the uppermost additional insulative structure 106a of the individual steps 122 of the staircase structure 120 at the processing stage of FIG. 1J. The additional insulative structures 106 defining each step 122 (e.g., the uppermost additional insulative structure 106a) may be directly adjacent to the strapping structures 160 on at least two sides (e.g., a lateral side and a vertical side).

Referring next to FIG. 1K, slots 162 (also referred to herein as "replacement gate slots") may be formed through the preliminary stack structure 102 (FIG. 1J) to facilitate the replacement of the additional insulative structures 106 (FIG. 1J) with conductive structures. The additional insulative structures 106 may be at least partially (e.g., substantially) replaced with the conductive structures 174 comprising at least one conductive material 180 to form a stack structure 175 comprising tiers 176 of the conductive structures 174 vertically interleaved with the insulative structures 104 through so-called "replacement gate" or "gate last" processing acts. The slots 162 may then be filled with dielectric material 166. Formation of the slots 162 and the conductive structures 174 is described in further detail below, along with additional components (e.g., structures, features) of the microelectronic device structure 100 at the processing stage depicted in FIG. 1K. FIG. 1L is a simplified, partial cross-sectional view of the microelectronic device structure 100 about the line L-L shown in FIG. 1K. For clarity and ease of understanding of the drawings and related description, not all features depicted in one of FIGS. 1K and 1L are depicted the other of FIGS. 1K and 1L.

As shown in FIG. 1K, the slots 162 may be formed to vertically extend (e.g., in the Z-direction) though the preliminary stack structure 102 (FIG. 1J), such as through the dielectric fill material 126, the insulative liner material 128, and the tiers 108 (FIG. 1J) of the insulative structures 104 and the additional insulative structures 106 (FIG. 1J). At least portions of each of the dielectric fill material 126, the insulative liner material 128, the insulative structures 104, and the additional insulative structures 106 are removed by exposing the respective materials to wet etch chemistries and/or dry etch chemistries, for example, in one or more material removal processes. Prior to formation of the slots 162, portions of the dielectric fill material 126 and the preliminary stack structure 102 including the structures 152 may be covered with an additional dielectric material (e.g., an additional portion of the dielectric material 116 (FIG. 1C)) and/or an additional mask material configured and positioned to protect the dielectric fill material 126 and the structures 152 from being removed (e.g., exhumed) during the material removal processes of the dielectric fill material 126 and the materials of the preliminary stack structure 102. While the slots 162 are illustrated as being formed after formation of the structures 152 for clarity and ease of understanding of the drawings and related description, the slots 162 may, alternatively, be formed before formation of the structures 152. For example, the slots 162 may be formed during (e.g., substantially simultaneously with) formation of the extended openings 131 (FIG. 1E) to reduce cost and the number of process acts conducted.

The slots 162 may extend to the source tier 110, such as to the first conductive material 112. Alternatively, the slots 162 may terminate at or within an insulative material overlying the first conductive material 112. The slots 162 may separate (e.g., divide) the microelectronic device structure 100 into block structures 164. Although FIG. 1K illustrates only three slots 162 and only two block structures 164, the disclosure is not so limited. The microelectronic device structure 100 may include a plurality of (e.g., four, five, six, eight) block structures 164, each separated from laterally neighboring (e.g., in the X-direction) block structures 164 by one of the slots 162. In other words, the slots 162 may divide the microelectronic device structure 100 into any desired quantity of block structures 164.

In addition, support structures 168 (e.g., additional support structures, mechanical support structures) may, optionally, be formed between at least some of the slots 162 within the staircase region 105, as shown in FIG. 1K. The support structures 168 may be formed to horizontally neighbor one or more areas of the structures 152, although other configurations may be contemplated.

The support structures 168, if present, may provide additional mechanical integrity and support to portions of the tiers 108 (FIG. 1J) of the insulative structures 104 (FIG. 1J) and the additional insulative structures 106 (FIG. 1J) within the staircase region 105, in addition to the mechanical support provided by the structures 152. The support structures 168 may be positioned within or proximate to regions of the preliminary stack structure 102 (FIG. 1J) prone to tier collapse during the replacement gate processing acts. In some embodiments, the support structures 168 are positioned horizontally proximate to the structures 152, such as between neighboring columns of the structures 152 and/or between a column of the structures 152 and one of the slots 162. In some such embodiments, the microelectronic device structure 100 may include the support structures 168 between horizontally neighboring portions of the slots 162 that are substantially absent (e.g., substantially devoid) of the structures 152.

The support structures 168 may be formed in openings vertically extending through the tiers 108 (FIG. 1J) of the preliminary stack structure 102 (FIG. 1J). The support structures 168 may individually include a liner material 170, and a fill material 172 surrounded by the liner material 170. For each of the support structures 168, the liner material 170 may be formed (e.g., conformally formed) within an opening formed in the preliminary stack structure 102. The liner material 170 may be continuous along a vertical distance of the preliminary stack structure 102. The liner material 170 may be formed of and include insulative material, such as a dielectric oxide material. For example, the material of the liner material 170 may include a silicon oxide material (e.g., relatively high-quality silicon oxide material, such as an ALD $SiO_x$). A material composition of the liner material 170 may be substantially the same as a material composition of the liner material 142 of the conductive contacts 140, or the material composition of the liner material 170 may be different than the material composition of the liner material 142 of the conductive contacts 140. The material of the liner material 170 may exhibit etch selectivity with respect to the additional insulative structures 106 (FIG. 1J). The liner material 170 may be formed by conventional techniques, such as by CVD or ALD. In some embodiments, the liner material 170 is formed by plasma-enhanced ALD (PEALD).

The fill material 172 of the support structures 168 may be formed adjacent (e.g., over) the liner material 170. In some embodiments, the fill material 172 is formed of and includes an insulative material, such as a silicon oxide material. In other embodiments, the fill material 172 is formed of and includes a conductive material including, but not limited to, N-doped polysilicon, P-doped polysilicon, undoped polysilicon, or a metal, such as tungsten. A material composition of the fill material 172 may be substantially the same as a material composition of the fill material 144 of the conductive contacts 140, or the material composition of the fill material 172 may be different than the material composition of the fill material 144 of the conductive contacts 140. In some such embodiments, one or more of the liner material 170 and the fill material 172 of the support structures 168 may be formed during (e.g., substantially simultaneous with) formation of the liner material 142 and the fill material 144, respectively, of the conductive contacts 140 in order to simplify manufacturing processes. The liner material 170 may substantially surround sidewalls of the fill material 172. In some embodiments, such as where the fill material 172 comprises an insulative material, the support structures 168 may not include the liner material 170 on sidewalls of the fill material 172, and the support structures 168 may only include the fill material 172 (e.g., the insulative material).

The fill material 172 of the support structures 168 may be formed to substantially fill remaining portions of the openings extending vertically through the dielectric fill material 126 and the preliminary stack structure 102 (FIG. 1J) and to the source tier 110. The support structures 168 may be proximate to the slots 162 and may be confined within the staircase region 105 of the microelectronic device structure 100. At least some of the support structures 168 may be formed to extend vertically from an upper surface of the dielectric fill material 126 to or within the first conductive material 112 of the source tier 110. Alternatively or additionally, at least some of the support structures 168 (e.g., including the conductive material as the fill material 172) may be formed to extend below the upper surface of first conductive material 112 into the second conductive material 114. In some embodiments, the support structures 168 are configured to provide one or more functions (e.g., electrical connections) in addition to support functions. In additional embodiments, the support structures 168 are configured to substantially only serve support functions, and the structures 152 (e.g., alone) are configured to provide electrical connections to the source tier 110. Upper surfaces of each of the dielectric fill material 126, the structures 152, and the support structures 168 may be substantially coplanar with one another. The conductive contacts 140 (and, hence, the structures 152) may have about a same height as the support structures 168, such as when each of the conductive contacts 140 and the support structures 168 vertically extend from a vertically uppermost boundary of the dielectric fill material 126 to or beyond a vertically uppermost boundary of the second conductive material 114 of the source tier 110 underlying the stack structure 175.

The support structures 168 may individually exhibit a substantially circular cross-sectional shape, as shown in the top-down view of FIG. 1K. However, the disclosure is not so limited. As a non-limiting example, in additional embodiments, the support structures 168 individually exhibit a substantially rectangular cross-sectional shape (e.g., a substantially square cross-sectional shape), or a different elongate cross-sectional shape (e.g., an oblong cross-sectional shape). A lateral dimension (e.g., a width, a diameter in a horizontal direction) of one or more of the support structures 168 may be relatively less than a lateral dimension of the structures 152. While only three support structures 168 are illustrated in FIG. 1K, the disclosure is not so limited, and additional support structures 168 may be located adjacent to the structures 152 within the block structures 164 between horizontally (e.g., in the X-direction) neighboring portions of the dielectric material 166 within the slots 162 within the staircase region 105.

Further, in some embodiments, at least some of the structures 152 may be configured as mechanical support structures, without being configured to provide electrical connection between the conductive structures 174 (FIG. 1L) and the source tier 110 (e.g., without forming the strapping structures 160). For example, the sacrificial material 132 (FIG. 1G) may be maintained (e.g., remain) laterally adjacent to the conductive contacts 140 in at least some of the structures 152, without forming the second openings 146 (FIG. 1H). Alternatively, the sacrificial material 132 may be replaced with insulative material (e.g., $SiO_x$, a carbon-containing material). In other embodiments, the sacrificial material 132 is initially be formed to include insulative material, which is maintained laterally adjacent to the conductive contacts 140. In other words, at least some of the support structures 168 may be formed (e.g., derived) from initial structures of the structures 152, but excluding the strapping structures 160. In additional embodiments, the staircase structure 120 is substantially free of additional support structures (e.g., the support structures 168) formed within the staircase region 105 and only the structures 152 including the strapping structures 160 serve as support structures within the staircase region 105.

Referring to FIG. 1L, the additional insulative structures 106 (FIG. 1J) may be selectively removed (e.g., exhumed) through the slots 162 (FIG. 1K). Spaces between vertically neighboring (e.g., in the Z-direction) insulative structures 104 may be filled with the conductive material 180 to form the conductive structures 174 and the stack structure 175 including the tiers 176 of the insulative structures 104 and the conductive structures 174.

In some embodiments, the conductive material 180 of the conductive structures 174 comprises tungsten (W). In other embodiments, the conductive material 180 of the conductive structures 174 comprises conductively doped polysilicon. For each of the conductive structures 174, the conductive material 180 thereof may be substantially homogeneous or may be substantially heterogeneous. In some embodiments, each of the conductive structures 174 is substantially homogeneous. In additional embodiments, at least one of the conductive structures 174 is substantially heterogeneous.

At least one vertically (e.g., in the Z-direction) lower conductive structure 174 of the stack structure 175 may be employed as at least one lower select gate (e.g., at least one source side select gate (SGS)) of the microelectronic device structure 100. In some embodiments, a single (e.g., only one) conductive structure 174 of a vertically lowermost tier 176 of the stack structure 175 is employed as a lower select gate (e.g., a SGS) of the microelectronic device structure 100. In addition, vertically (e.g., in the Z-direction) upper conductive structure(s) 174 of the stack structure 175 may be employed as upper select gate(s) (e.g., drain side select gate(s) (SGDs)) of the microelectronic device structure 100. In some embodiments, horizontally neighboring conductive structures 174 of a vertically uppermost tier 176 of the stack structure 175 (e.g., separated from each other by slots) are employed as upper select gates (e.g., SGDs) of the microelectronic device structure 100. In some embodiments, more than one (e.g., two, four, five, six) conductive structures 174 are employed as upper select gates (e.g., SGDs) of the microelectronic device structure 100.

In addition to serving as conductive contacts (e.g., the conductive contacts 140), the structures 152 may also serve as support structures during and/or after the formation of one or more components of the microelectronic device structure 100. For example, the structures 152 may serve as support structures for the formation of the conductive structures 174 during replacement of the additional insulative structures 106 (FIG. 1J) to form the conductive structures 174. The structures 152 may impede (e.g., prevent) tier collapse during the selective removal of the additional insulative structures 106. By forming the conductive contacts 140 of the structures 152 to extend entirely through the vertical extent of the preliminary stack structure 102 (FIG. 1J) (e.g., below the steps 122 of the staircase structure 120), lower portions of the conductive contacts 140 may provide additional support to lowermost portions of the preliminary stack structure 102, compared to conventional device structures having conductive contacts that terminate at steps of staircase structures. Further, formation of the structures 152, including the conductive contacts 140 and the strapping structures 160, prior to performing replacement gate processing acts may provide increased structural support within the staircase structure 120 of the staircase region 105, without undesirably increasing the overall width (e.g., horizontal footprint) of the staircase region 105.

As shown in FIG. 1L, one or more side surfaces (e.g., lateral side surfaces, horizontal side surfaces) of the isolation regions 134 may directly contact side surfaces of the conductive structures 174 of the stack structure 175 along interfaces 178 (e.g., vertical interfaces). The presence of the liner material 136 provides the isolation regions 134 between the conductive contacts 140 and the conductive structures 174, such that the conductive structures 174 are remote (e.g., isolated) from the conductive contacts 140 by the isolation regions 134. After forming the conductive material 180 of the conductive structures 174 of the stack structure 175, the slots 162 (FIG. 1K) may be filled with the dielectric material 166 (FIG. 1K).

The dielectric material 166 may be formed of and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the dielectric material 166 may substantially the same as a material composition of one or more of the dielectric fill material 126 and the insulative structures 104 of the stack structure 175, or the material composition of the dielectric material 166 may be different than the material composition of the dielectric fill material 126 and the insulative structures 104. In some embodiments, the dielectric material 166 is formed of and includes $SiO_2$.

The strapping structures 160 may be considered portions (e.g., vertically projecting structures, horizontally projecting structures) of the structures 152. For example, as shown in FIG. 1L, the conductive contacts 140 of the structures 152 may individually include the fill material 144 in electrical communication with the source tier 110, such as with the second conductive material 114 thereof, without being in electrical communication with all of the conductive structures 174 of the stack structure 175 vertically underlying (e.g., in the Z-direction) individual steps 122 of the staircase structure 120. In addition, the structures 152 may also individually include the conductive material 154 external to the conductive contacts 140, corresponding to one of the strapping structures 160, in electrical communication with the fill material 144 of the conductive contacts 140 and with the conductive material 180 of one of the conductive structures 174. For example, an uppermost one of the conductive structures 174 defining each step 122 (e.g., an uppermost conductive structure 174a) may be configured as a contact region for the strapping structures 160 of each of the structures 152. At least some (e.g., each) of the conductive contacts 140 are operably coupled to one of the conductive structures 174 of the stack structure 175 at one of the steps 122 of the staircase structure 120 through the strapping structures 160.

Accordingly, an individual strapping structure 160, in combination with the conductive contacts 140, of the structures 152 may be configured to facilitate electrical communication between the source tier 110 and an uppermost conductive structure 174a defining an individual step 122 of the staircase structure 120. Stated another way, the uppermost conductive structure 174a may be provided in electrical communication with the conductive contacts 140 (and, hence, the source tier 110) by way of the strapping structures 160 formed to extend therebetween. Further, the strapping structure 160 of at least one of the structures 152 is vertically offset from the strapping structure 160 of at least one other of the structures 152. Accordingly, the structures 152 may serve as conductive contacts to the conductive structures 174 of the stack structure 175, as well as conductive contacts to the source tier 110, while providing increased structural support within the staircase structure 120.

Forming the structures 152, including the conductive contacts 140 and the strapping structures 160, to facilitate electrical communication between the source tier 110 and the conductive structures 174 may reduce a quantity of the support structures 168 (FIG. 1K) within the staircase region 105. By forming the strapping structures 160 to extend laterally adjacent to and over the conductive contacts 140, portions (e.g., the first portion 154a) of the conductive material 154 of the strapping structures 160 may be electrically coupled to the fill material 144 of the conductive contacts 140 along the interfaces 158 to provide enhanced electrical connection thereto, without undesirably increasing the overall width (e.g., horizontal footprint) of the staircase region 105.

For example, facilitating electrical communication between the source tier 110 and the conductive structures 174 through the conductive contacts 140 and the strapping structures 160 may facilitate forming the structures 152 within the staircase structure 120 without the need to form complex conductive pathways above the stack structure 175. Accordingly, a greater quantity of the steps 122 of the staircase structure 120 may be provided within a given area of the microelectronic device structure 100 as compared to conventional microelectronic device structure configurations. By providing the structures 152 (including the conductive contacts 140 and the strapping structures 160 thereof) within the staircase structure 120, such configurations may also allow for reduced congestion in conductive pathways above the stack structure 175, with or without formation of the support structures 168. By reducing congestion in conductive pathways above the stack structure 175, spacing of the conductive features may be increased, resulting in a decrease in parasitic (e.g., stray) capacitance between adjacent conductive features during use and operation of the microelectronic device structure 100.

FIG. 1M illustrates an enlarged portion of box M of FIG. 1K, in accordance with the embodiment of the microelectronic device structure 100 of FIG. 1K. For clarity and ease of understanding the drawings and associated description, surrounding materials including the dielectric fill material 126 are absent from FIG. 1M. Portions of the liner material 142 and the fill material 144 of the conductive contacts 140 and portions of the conductive material 154 of the structures 152 are illustrated at an elevational level of the insulative liner material 128 over each step 122 of the staircase structure 120 (FIG. 1N). Additional portions of the conductive material 154 may laterally (e.g., in the X-direction, in the Y-direction) surround the liner material 142 at an elevational level of the uppermost conductive structure 174a (FIG. 1N). Accordingly, the conductive material 154 (also described herein as the strapping structures 160) of an individual structure 152 may be located horizontally proximate to and may at least partially (e.g., substantially) surround the materials (e.g., the liner material 142, the fill material 144) of the conductive contact 140 thereof. The insulative liner material 128 may be located horizontally proximate to and may at least partially (e.g., substantially) surround the materials of the structures 152.

As shown in FIG. 1M, each of the conductive contacts 140 and the strapping structures 160 of the structures 152 may be horizontally centered within individual steps 122 of the staircase structure 120 (FIG. 1N), although other configurations may be contemplated. A lateral dimension (e.g., a second width $W_2$ in the X-direction) of one or more of the steps 122 may be relatively larger than a lateral dimension (e.g., a first width $W_1$, a diameter in the X-direction) of an individual structure 152 (including the conductive contacts 140 and the strapping structures 160 thereof). By way of non-limiting example, the first width $W_1$ may be within a range of from about 300 nm to about 1000 nm (e.g., 1 μm), such as from about 300 nm to about 400 nm, from about 400 nm to about 500 nm, from about 500 nm to about 600 nm, from about 600 nm to about 700 nm, from about 700 nm to about 800 nm, from about 800 nm to about 900 nm, or from about 900 nm to about 1000 nm. However, the disclosure is not so limited and the first width $W_1$ may be different than those described above. In some embodiments, the second width $W_2$ is within a range from about 1.5 times greater than the first width $W_1$ of the structure 152 to about 2.5 times the first width $W_1$ of the structure 152 at a lateral boundary of the structure 152 at an elevational level of the insulative liner material 128. In some embodiments, the second width $W_2$ is at least about 2.0 times the first width $W_1$. In some embodiments, the second width $W_2$ is about the same size as the first width $W_1$. In other embodiments, the second width $W_2$ is such that the lateral boundary of the structures 152 at an elevational level of the insulative liner material 128 overlying the staircase structure 120 does not laterally extend beyond the steps 122 to reduce or prevent electrical shorting of the structures 152 to additional conductive structures 174 of the stack structure 175. Stated another way, the second width $W_2$ may be sized such that the structures 152 do not laterally extend beyond the lateral boundary of the steps 122.

FIG. 1N illustrates an enlarged portion of box N of FIG. 1L, in accordance with the embodiment of the microelectronic device structure 100 of FIG. 1L. In some embodiments, remaining portions of the upper portions 128a of the insulative liner material 128 are maintained (e.g., remain) vertically over each step 122 of the staircase structure 120. In other embodiments, the staircase structure 120 lacks the insulative liner material 128 thereover, and the dielectric fill material 126 is directly vertically adjacent to the uppermost conductive structure 174a. The remaining portions of the upper portions 128a of the insulative liner material 128, if present, may laterally (e.g., in the X-direction, in the Y-direction) surround a first portion 160a (e.g., an upper portion) of the strapping structures 160, and the uppermost conductive structure 174a of the individual steps 122 may laterally surround a second portion 160b (e.g., a lower portion) of the strapping structures 160.

The first portion 160a of the strapping structures 160 may laterally surround a first portion 142a (e.g., an upper portion) of the liner material 142 of the conductive contacts 140 at an elevational level of the dielectric fill material 126 and the insulative liner material 128 over each step 122 of the staircase structure 120. The second portion 160b of the strapping structures 160 may laterally surround a second portion 142b (e.g., a lower portion) of the liner material 142 at an elevational level of the uppermost conductive structure 174a of the individual steps 122. Accordingly, the second portion 160b of the strapping structures 160 (also described herein as the third portion 154c of the conductive material 154) of an individual structure 152 may be located below a lowermost boundary of the first portion 160a of the strapping structures 160 (also described herein as the second portion 154b of the conductive material 154) thereof. The third portion 154c of the conductive material 154 laterally intervenes between the uppermost conductive structure 174a and the liner material 142 of the conductive contacts 140. The first portion 160a and the second portion 160b of the strapping structures 160 may include substantially the same material composition with no easily discernable physical interface therebetween.

In some embodiments, only a lower surface of each of the strapping structures 160 is in physical contact with any of the conductive structures 174 of the stack structure 175. In other embodiments, the lower surfaces of at least some (e.g., each) of the strapping structures 160 are in physical contact with the uppermost conductive structure 174a along horizontal interfaces 184, and side surfaces of the strapping structures 160 are in physical contact with the uppermost conductive structure 174a along vertical interfaces 186, as shown in FIG. 1N. Accordingly, portions of the strapping structures 160 (e.g., the second portion 160b thereof) may be laterally adjacent to the uppermost conductive structure 174a located vertically adjacent (e.g., between) the insulative liner material 128 overlying the steps 122 of the staircase structure 120 and the uppermost insulative structure 104a (FIG. 1L) of the stack structure 175 (FIG. 1L) in the vertical direction (e.g., the Z-direction). Additional portions of the strapping structures 160 (e.g., the first portion 160a thereof) may also be vertically adjacent to the uppermost conductive structure 174a. Stated another way, the first portion 160a and the second portion 160b of the strapping structures 160 may form an "L-shaped" structure of the strapping structures 160 proximate the upper surfaces and the side surfaces of the uppermost conductive structure 174a of the individual steps 122. Therefore, the strapping structures 160 physically contact the uppermost conductive structure 174a on at least two consecutive sides (e.g., a lateral side and a vertical side). Thus, multidimensional (e.g., two-dimensional) contact regions of the uppermost conductive structure 174a may be formed adjacent to two corresponding consecutive sides of the strapping structures 160. Forming the multidimensional contact regions of the uppermost conductive structure 174a further enhances (e.g., further increases) an available area having more than one side (e.g., two sides) in which to form the strapping structures 160.

Accordingly, the shape of the structures 152 including the conductive contacts 140 substantially surrounded by the strapping structures 160 may facilitate a greater margin for electrical connection to the uppermost conductive structure 174a of the individual steps 122 of the staircase structure 120 compared to conventional microelectronic device structures. Further, the shape of the structures 152, including the strapping structures 160 laterally adjacent and external to the conductive contacts 140, may simplify manufacturing processes by avoiding material removal processes within the conductive contacts 140 and may provide increased process margins, which, in turn, may facilitate a reduction in capacitive coupling of the conductive contacts 140 compared to conventional microelectronic device structures.

As shown in FIG. 1N, a conductive liner material 182 may be formed within the spaces between the vertically neighboring insulative structures 104. In some such embodiments, the conductive structures 174 individually comprise the conductive liner material 182 in contact with the insulative structures 104 and the conductive material 180 in contact with the conductive liner material 182. The conductive liner material 182 may be vertically interposed between the conductive material 180 and an insulative structure 104. For ease of illustration and understanding, the conductive liner material 182 is illustrated within a single space between the vertically neighboring insulative structures 104 in FIG. 1N, but it will be understood that the microelectronic device structure 100 may include the conductive liner material 182 within additional (e.g., each of the) spaces between the vertically neighboring insulative structures 104. The conductive structures 174 may be located at locations corresponding to the locations of the additional insulative structures 106 (FIG. 1J) removed through the slots 162 (FIG. 1K).

The conductive liner material 182 (if formed) surrounding the conductive structures 174 may be formed of and include, for example, at least one seed material from which the conductive material 180 may be formed. The conductive liner material 182 may be formed of and include, for example, one or more of at least one (e.g., titanium, tantalum), at least one metal nitride (e.g., tungsten nitride, titanium nitride, tantalum nitride), or at least one additional material. In some embodiments, the conductive liner material 182 comprises titanium nitride ($TiN_x$).

In some such embodiments, at least portions of the conductive liner material 182 proximate one or more of the conductive structures 174 (e.g., the uppermost conductive structure 174a) adjacent to the strapping structures 160 of the structures 152 may be absent (e.g., removed). Accordingly, the conductive material 180 of the uppermost conductive structure 174a may be formed directly neighboring (e.g., in the Y-direction, in the Z-direction) the strapping structures 160. Alternatively, at least one material (e.g., the conductive liner material 182) may vertically intervene between the conductive material 180 of the uppermost conductive structure 174a and the strapping structures 160. In either instance, the strapping structures 160 may be formed directly neighboring the uppermost conductive structure 174a.

Since each of the conductive contacts 140 vertically extend completely through the stack structure 175 (FIG. 1L), the conductive contacts 140 vertically extends through the steps 122 of the staircase structure 120 without terminating at upper surfaces thereof. As shown in FIG. 1N, the liner material 136 within the isolation regions 134 horizontally intervenes between the conductive contacts 140 and the additional conductive structures 174 aligned below the uppermost conductive structure 174a, such that the additional conductive structures 174 are remote (e.g., isolated) from the conductive contacts 140 by the isolation regions 134. For example, the conductive contacts 140 may extend through each of the dielectric fill material 126 and the steps 122 of the staircase structure 120, without contacting the additional conductive structures 174 thereunder. Each step 122 may individually be in contact with one of the conductive contacts 140 through the conductive material 154 (also described as one of the strapping structures 160) of the structures 152. As described above, the first portion 160a and the second portion 160b of the strapping structures 160 may be configured (e.g., sized and shaped) to maximize (e.g., increase) overlap with a contact region of the uppermost conductive structure 174a of the individual steps 122.

A lateral dimension (e.g., a third width $W_3$, a diameter in the Y-direction) of the first portion 142a (e.g., the upper portion) of the liner material 142 may be relatively less than a lateral dimension (e.g., a fourth width $W_4$, a diameter in the Y-direction) of the second portion 142b (e.g., the lower portion) of the liner material 142. In some embodiments, the third width $W_3$ of the first portion 142a of the liner material 142 may be within a range of from about 100 nm to about 300 nm, such as from about 100 nm to about 150 nm, from about 150 nm to about 200 nm, from about 200 nm to about 250 nm, or from about 250 nm to about 300 nm, and the fourth width $W_4$ of the second portion 142b of the liner material 142 may be within a range of from about 150 nm to about 500 nm, such as from about 150 nm to about 200 nm, from about 200 nm to about 300 nm, from about 300 nm to about 400 nm, or from about 400 nm to about 500 nm. In additional embodiments, the third width $W_3$ of the first portion 142a of the liner material 142 is substantially the same as (e.g., substantially equal to) the fourth width $W_4$ of the second portion 142b thereof, such as when the first portion 142a of the liner material 142 is not recessed.

As shown in FIG. 1N, the uppermost conductive structure 174a may be separated from the liner material 142 of the conductive contacts 140, by the strapping structures 160 (e.g., the second portion 160b thereof), by a distance $D_1$ in the Y-direction. The additional conductive structures 174 underlying the uppermost conductive structure 174a may be separated from the liner material 142 of the conductive contacts 140, by the isolation regions 134, by the distance $D_1$. By way of non-limiting example, the distance $D_1$ may be within a range of from about 20 nm to about 100 nm, such as from about 20 nm to about 40 nm, from about 40 nm to about 60 nm, from about 60 nm to about 80 nm, or from about 80 nm to about 100 nm. In some embodiments, the distance $D_1$ is about 80 nm, which corresponds to a horizontal width of the third portion 154c in the vertical openings 150 (FIG. 1I) in the Y-direction and to a horizontal width of the liner material 136 within the isolation regions 134 in the Y-direction. However, the disclosure is not so limited and the distance $D_1$ may be different than those described above. Further, the horizontal width of the liner material 136 may vary along a vertical height of each of the conductive structures 174.

Further, a lateral dimension (e.g., a fifth width $W_5$, a diameter in the Y-direction) of the second portion 160b of the strapping structures 160 may be relatively less than a lateral dimension (e.g., the first width $W_1$ (FIG. 1M) of the structures 152, corresponding to the first portion 160a of the strapping structures 160). Thus, the first width $W_1$ of the structures 152 is relatively greater than the fifth width $W_5$ of the second portion 160b of the strapping structures 160, which corresponds to a lateral dimension of the isolation regions 134. In some embodiments, the fifth width $W_5$ of the second portion 160b of the strapping structures 160 may be within a range of from about 150 nm to about 500 nm, such as from about 150 nm to about 200 nm, from about 200 nm to about 300 nm, from about 300 nm to about 400 nm, or from about 400 nm to about 500 nm. However, the disclosure is not so limited and the fifth width $W_5$ may be different than those described above.

In some embodiments, the first width $W_1$ is within a range from about 1.5 times greater than the fifth width $W_5$ of the second portion 160b of the strapping structures 160 to about 2.5 times the fifth width $W_5$ at a lateral boundary of the strapping structures 160 at an elevational level of the uppermost conductive structure 174a. In some embodiments, the first width $W_1$ is at least about 2.0 times the fifth width $W_5$. The relative widths of the first portion 160a and the second portion 160b of the strapping structures 160 may be tailored to have a desired value that may be selected at least partially based on design requirements of the microelectronic device structure 100. Specifically, the shape of the structures 152 may facilitate an increased contact region with the uppermost conductive structure 174a of the individual steps 122 compared to conventional microelectronic device structures. For example, the size, shape, and orientation of the strapping structures 160 may facilitate an increased surface area available for contact with the uppermost conductive structure 174a. As a result, the RC (product of resistance and capacitance) of the structures 152 including the conductive contacts 140 and the strapping structures 160 may be optimized, which may correlate to an increase in the performance of a device containing the microelectronic device structure 100 by allowing for a reduction in operational speed (e.g., programming time).

One of ordinary skill in the art will appreciate that, in accordance with additional embodiments of the disclosure, the features and feature configurations described above in relation to FIGS. 1A through 1N may be adapted to design needs of different microelectronic devices (e.g., different memory devices) depending on desired electrical performance properties of the microelectronic devices. By way of non-limiting example, in accordance with additional embodiments of the disclosure, FIGS. 2A through 2F are simplified, partial top-down views (FIG. 2A) and simplified, partial cross-sectional views (FIGS. 2B through 2F) of a method of forming a microelectronic device structure having a different configuration than the microelectronic device structure 100. Throughout the remaining description and the accompanying figures, functionally similar features (e.g., structures, devices) are referred to with similar reference numerals. To avoid repetition, not all features shown in the remaining figures (including FIGS. 2A through 2F) are described in detail herein. Rather, unless described otherwise below, a feature designated by a reference numeral of a previously described feature (whether the previously described feature is first described before the present paragraph, or is first described after the present paragraph) will be understood to be substantially similar to the previously described feature.

Figure 2A:
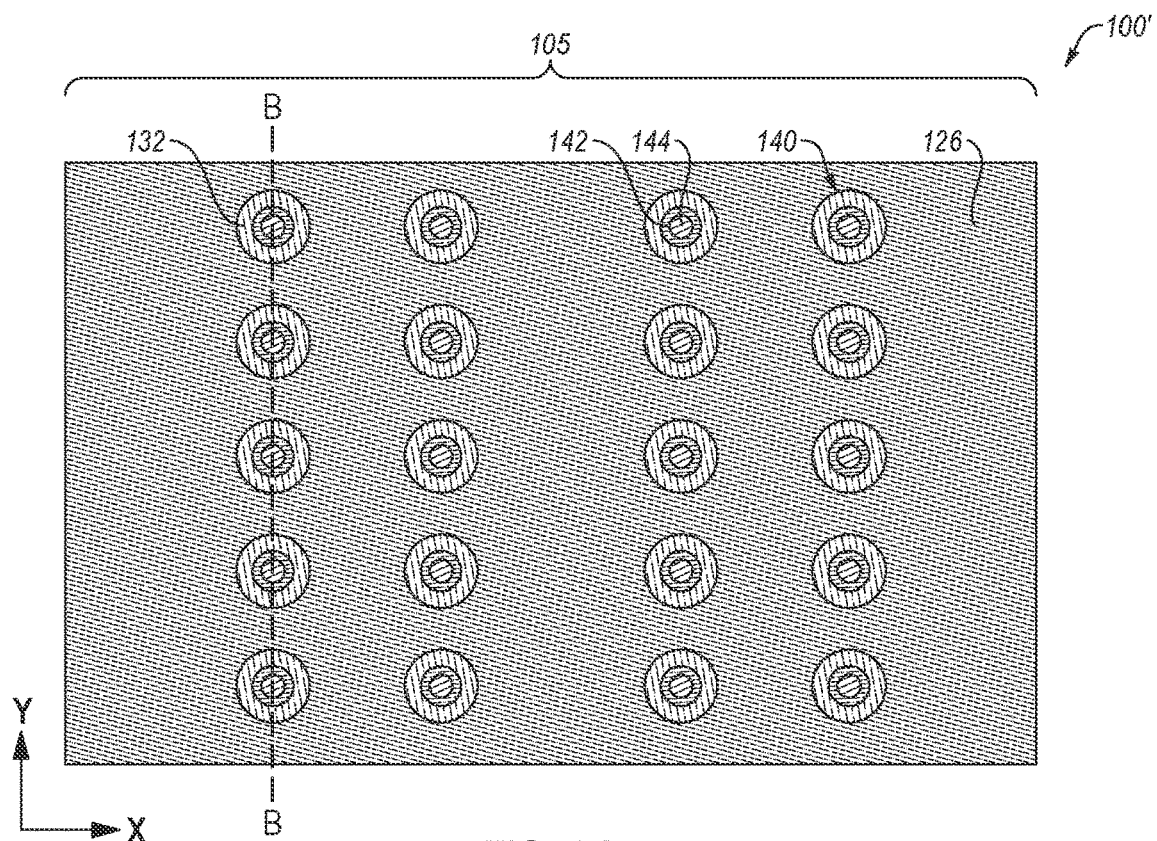
FIGS. 2A through 2F are simplified, partial top-down views (FIG. 2A) and simplified, partial cross-sectional views (FIGS. 2B through 2F) illustrating a method of forming a microelectronic device, in accordance with additional embodiments of the disclosure.
Figure 2B:
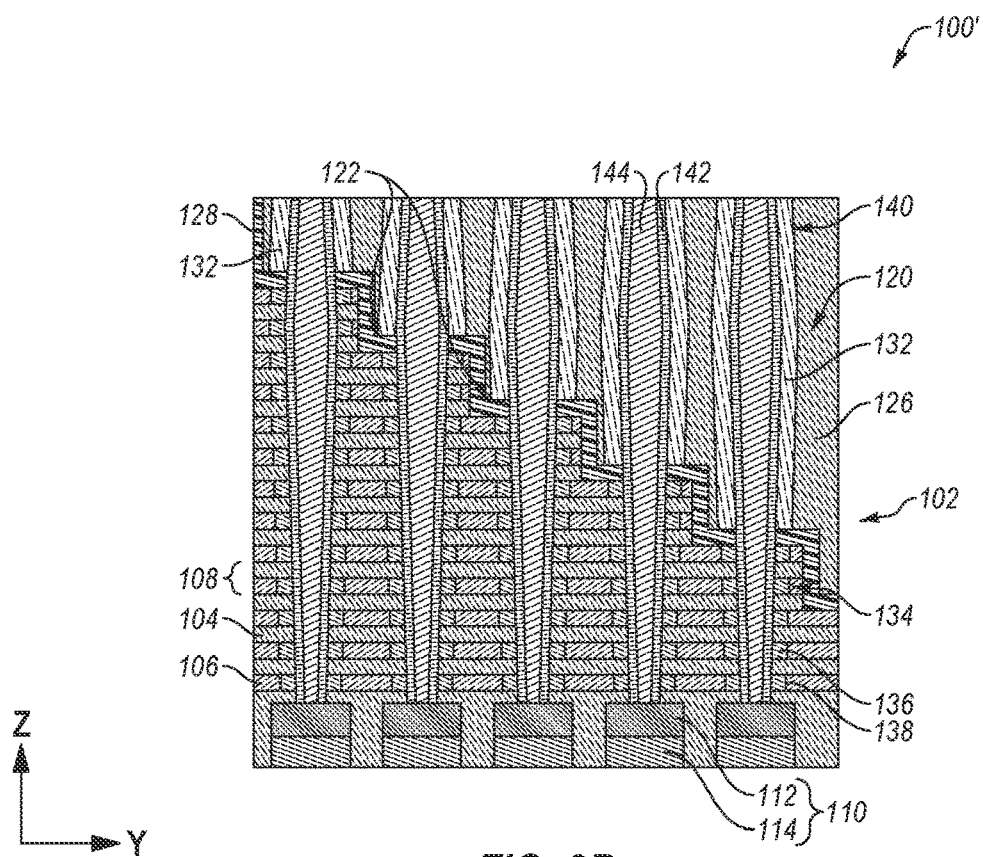

FIG. 2A is a simplified, partial top-down view of a microelectronic device structure 100' (e.g., a memory device, such as a 3D NAND Flash memory device). At the processing stage depicted in FIG. 2A, the microelectronic device structure 100' may be substantially similar to the microelectronic device structure 100 at the processing stage depicted in FIG. 1F. FIG. 2B is simplified cross-sectional views of the microelectronic device structure 100' about the line B-B of FIG. 2A. For clarity and ease of understanding of the drawings and related description, not all features depicted in one of FIGS. 2A and 2B are depicted in the other of FIGS. 2A and 2B.

The microelectronic device structure 100' illustrated in FIGS. 2A and 2B includes the preliminary stack structure 102, and the conductive contacts 140 including the liner material 142 and the fill material 144 vertically extending through the dielectric fill material 126 and the preliminary stack structure 102. The preliminary stack structure 102 of the microelectronic device structure 100' may also be formed to include the vertically alternating (e.g., in the Z-direction) sequence of the insulative structures 104 and the additional insulative structures 106 arranged in the tiers 108. The preliminary stack structure 102 may be formed to vertically overlie the source tier 110 including the first conductive material 112 and the second conductive material 114. The microelectronic device structure 100' may include the staircase structure 120 including the steps 122, the dielectric fill material 126 overlying the staircase structure 120 and, optionally, the insulative liner material 128 vertically overlying (e.g., in the Z-direction) the staircase structure 120. The dielectric material 116 (FIGS. 1A and 1B) may, optionally, be formed to vertically overlie the preliminary stack structure 102.

Referring to collectively to FIGS. 2A and 2B, the microelectronic device structure 100' may be formed to include the isolation regions 134 including the liner material 136 laterally adjacent to the liner material 142 of the conductive contacts 140 and directly contacting the side surfaces of the remaining portions of the additional insulative structures 106 along the interfaces 138.

The additional insulative structures 106 may be separated from the liner material 142 of the conductive contacts 140, by the isolation regions 134, as in processing stage of the embodiment of the disclosure previously described with reference to FIG. 1E. However, as shown in FIG. 2B, configurations of the isolation regions 134 may be modified relative to the configurations thereof previously described with reference to FIG. 1E to spatially accommodate subsequently formed features (e.g., the strapping structures 160), as described in further detail below. By way of non-limiting example, a lateral dimension (e.g., horizontal width in the Y-direction) of the isolation regions 134 may be within a range of from about 40 nm to about 200 nm, such as from about 40 nm to about 80 nm, from about 80 nm to about 120 nm, from about 120 nm to about 160 nm, or from about 160 nm to about 200 nm. In some embodiments, the lateral dimension of the isolation regions 134 is about 160 nm, which lateral dimension is relatively larger than that of the previous embodiment.

The microelectronic device structure 100' may also be formed to include the sacrificial material 132 adjacent to (e.g., laterally adjacent to) the dielectric fill material 126 and adjacent to (e.g., vertically adjacent to) the steps 122 of the staircase structure 120. At the processing stage of FIGS. 2A and 2B, the microelectronic device structure 100' may be formed to include the liner material 142 of the conductive contacts 140 laterally adjacent to and substantially surrounded by the sacrificial material 132 and the fill material 144 thereof laterally adjacent to and substantially surrounded by the liner material 142, as in processing stage of the embodiment of the disclosure previously described with reference to FIG. 1C. However, as collectively shown in FIGS. 2A and 2B, configurations of the sacrificial material 132 may be modified relative to the configurations thereof previously described with reference to FIG. 1C to spatially accommodate the subsequently formed features. By way of non-limiting example, the sacrificial material 132 may have a thickness within a range of from about 50 nm to about 200 nm, such as from about 50 nm to about 75 nm, from about 75 nm to about 125 nm, or from about 125 nm to about 150 nm, or from about 150 nm to about 200 nm. However, the disclosure is not so limited and the thickness of the sacrificial material 132 may be different than those described above. Accordingly, the thickness of the sacrificial material 132 of the embodiment of FIGS. 2A and 2B may be relatively larger than that of the previous embodiment. In addition, the width of the openings 130 (FIG. 1B) of the embodiment of FIGS. 2A and 2B may be relatively larger than that of the previous embodiment.

Further, the sacrificial material 132 of the microelectronic device structure 100' may exhibit a greater lateral extent (e.g., a width in the Y-direction) than a lateral extent of the isolation regions 134, as shown in FIG. 2B. In other words, the remaining portions of the additional insulative structures 106 may be adjacent to (e.g., underlying) the sacrificial material 132. In additional embodiments, side surfaces of the sacrificial material 132 are substantially aligned with side surfaces of the isolation regions 134 or, alternatively, the isolation regions 134 may exhibit a slightly greater lateral extent than a lateral extent of the sacrificial material 132.

In addition, configurations of the liner material 142 of the conductive contacts 140 may be modified relative to the configurations thereof previously described with reference to FIGS. 1F and 1G to further spatially accommodate the subsequently formed features. By way of non-limiting example, the liner material 142 may have a thickness within a range of from about 5 nm to about 30 nm, such as from about 5 nm to about 10 nm, from about 10 nm to about 20 nm, from about 20 nm to about 25 nm, or from about 25 nm to about 30 nm. In some embodiments, the thickness of the liner material 142 is about 20 nm. However, the disclosure is not so limited and the thickness of the liner material 142 may be different than those described above. Accordingly, the thickness of the liner material 142 of the conductive contacts 140 of the embodiment of FIGS. 2A and 2B may be relatively less than the thickness of the liner material 142 of the embodiment of FIGS. 1F and 1G. Further, the liner material 142 of the embodiment of FIGS. 2A and 2B may exhibit a thickness that is substantially uniform (e.g., substantially constant, non-variable) along a vertical extent thereof.

Figure 2C:
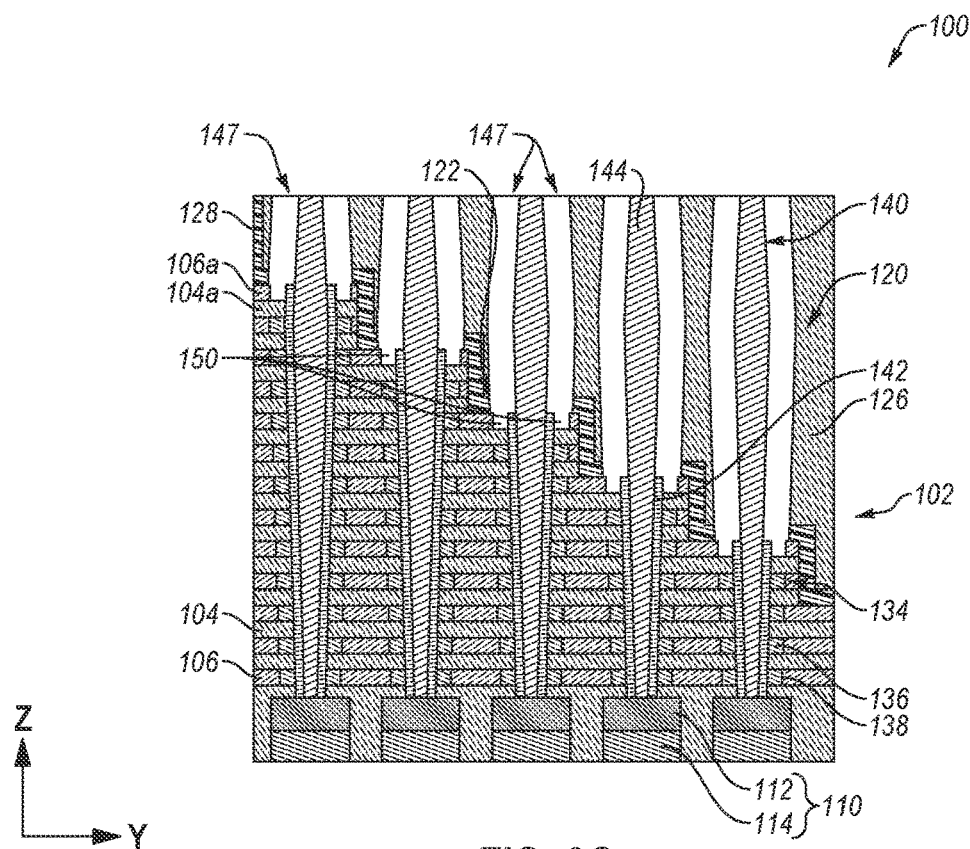

Referring to FIG. 2C, following formation of the conductive contacts 140, the sacrificial material 132 (FIG. 2B) may be removed (e.g., exhumed) to form the second openings 146 (see FIG. 1H) vertically extending (e.g., in the Z-direction) through the dielectric fill material 126, as in the previous embodiment of FIG. 1H. However, since the thickness of the sacrificial material 132 of the embodiment of FIGS. 2A and 2B is relatively larger than the thickness of the sacrificial material 132 of the previous embodiment, a lateral dimension (e.g., a horizontal width in the Y-direction) of the second openings 146 of the microelectronic device structure 100' will be relatively larger than that of the second openings 146 of FIG. 1H.

As shown in FIG. 2C, the expanded openings 147 may be formed to vertically extend (e.g., in the Z-direction) through the dielectric fill material 126 to expand (e.g., increase) the horizontal dimensions of the second openings 146 (FIG. 1H). In addition, portions of the liner material 136 of the isolation regions 134 of the uppermost additional insulative structure 106a may be removed (e.g., exhumed) to form the vertical openings 150 in communication with the expanded openings 147 and to expose upper surfaces of the uppermost insulative structure 104a.

In addition, portions of the liner material 142 of the conductive contacts 140 may be selectively removed. For example, the upper portions of the liner material 142 of the conductive contacts 140 of the microelectronic device structure 100' may be substantially removed (e.g., substantially exhumed) above an elevational level of the uppermost additional insulative structure 106a of the individual steps 122 of the staircase structure 120. Thus, side surfaces (e.g., lateral side surfaces) of the fill material 144 of the conductive contacts 140 may be exposed in regions laterally adjacent to the dielectric fill material 126 and the insulative liner material 128 at the processing stage of FIG. 2C. In other words, microelectronic device structure 100' is substantially devoid (e.g., substantially free) of the liner material 142 of the conductive contacts 140 laterally adjacent to the dielectric fill material 126 and the insulative liner material 128, which configuration differs from that of the previous embodiment, as shown in FIG. 1I. Accordingly, a lateral dimension (e.g., a width) of the expanded openings 147 of the microelectronic device structure 100' may be relatively larger than that of the expanded openings 147 of the embodiment of FIG. 1I.

Figure 2D:
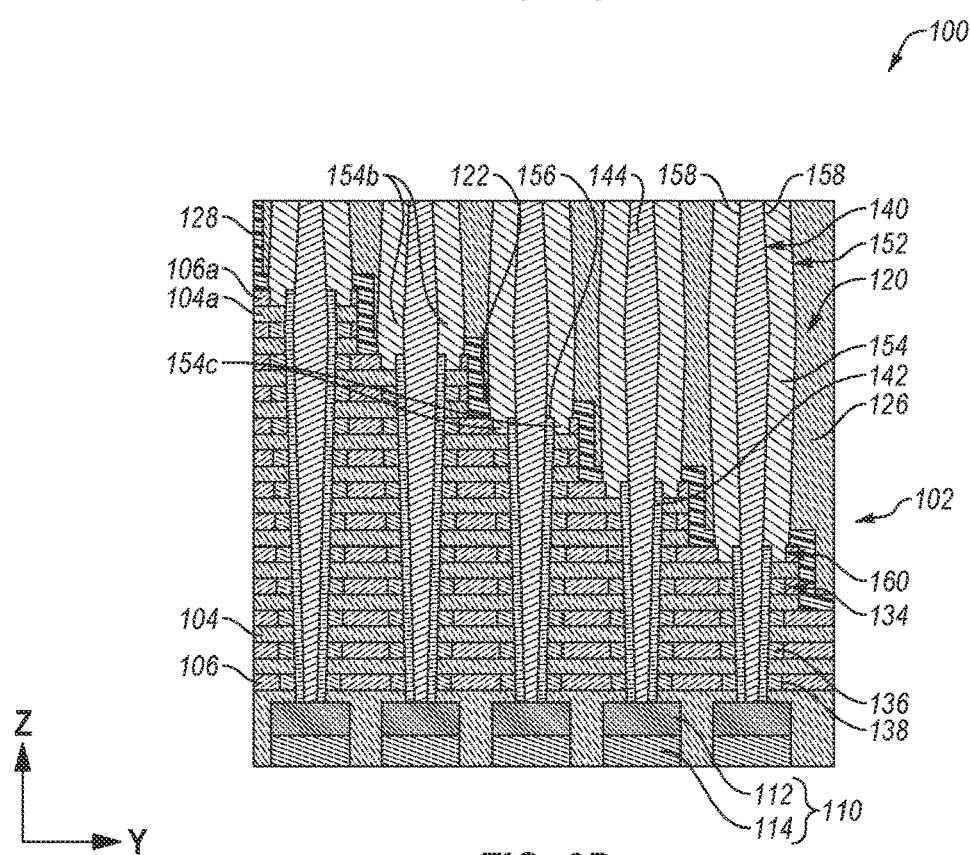

Referring to FIG. 2D, following formation of the expanded openings 147 (FIG. 2C) and the vertical openings 150 (FIG. 2C), the conductive material 154 may be formed within each of the expanded openings 147 and the vertical openings 150 to form the structures 152 adjacent to (e.g., directly laterally adjacent to) the liner material 142 and the fill material 144 of the conductive contacts 140. The structures 152 are defined by the conductive material 154 (also described herein as the strapping structures 160) and the materials (e.g., the liner material 142, the fill material 144) of the conductive contacts 140. Lower surfaces of the conductive material 154 may directly contact upper surfaces of the lower portions of the liner material 142 along the interfaces 156 (e.g., horizontal interfaces), and side surfaces (e.g., lateral side surfaces) of an upper portion of the conductive material 154 of the structures 152 may be in direct physical contact with side surfaces of the fill material 144 along the interfaces 158 (e.g., vertical interfaces).

The conductive material 154 may be directly adjacent to and operably coupled (e.g., electrically connected) with the fill material 144. In some embodiments, the conductive material 154 of the structures 152 is integral and continuous with the fill material 144 of the conductive contacts 140 with no easily discernable physical interface therebetween at an elevational level above the liner material 142. The fill material 144 may physically contact the strapping structures 160 along a vertical extent of upper portions of the conductive contacts 140 laterally adjacent to the dielectric fill material 126. Further, the conductive material 154 may be formed over exposed portions of the uppermost insulative structure 104a and may fill (e.g., substantially fill) the vertical openings 150 (FIG. 2C). Accordingly, the conductive material 154 of individual structures 152 includes the second portion 154b within the expanded openings 147 and the third portion 154c within the vertical openings 150. Therefore, the conductive material 154 is laterally adjacent to the liner material 142 of the conductive contacts 140 only within the vertical openings 150, which configuration differs from the conductive material 154 laterally intervening between the dielectric fill material 126 and the upper portions of the liner material 142 of the microelectronic device structure 100, as shown in FIG. 1J.

Figure 2E:
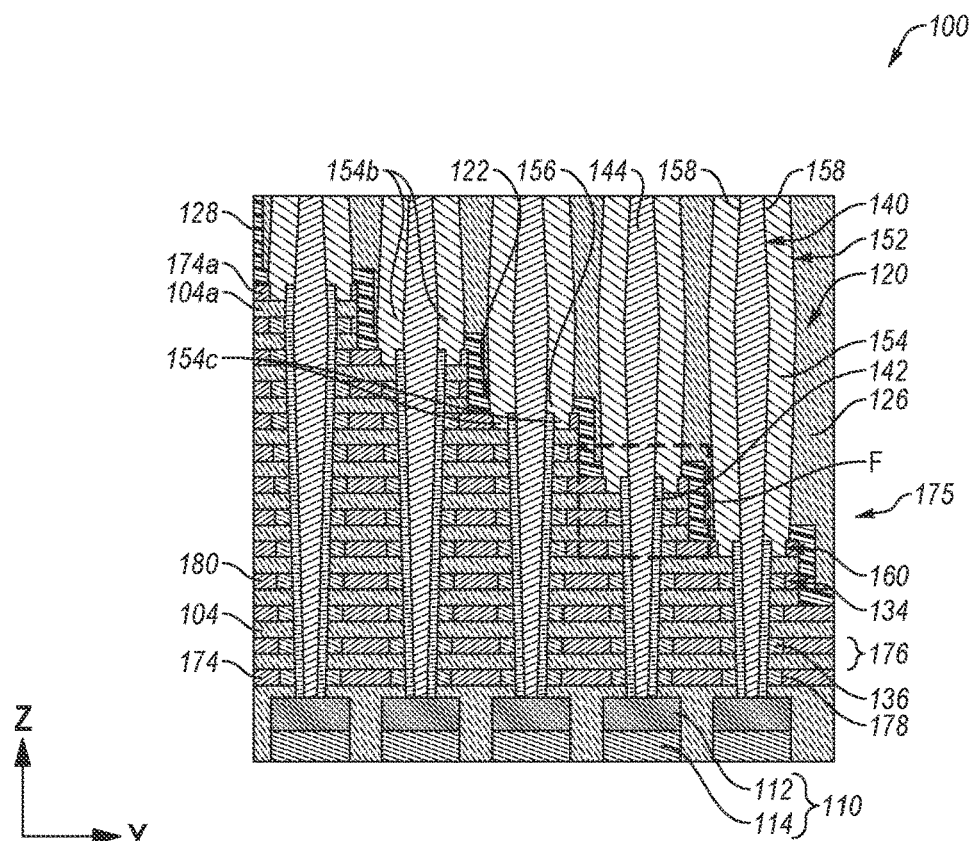

Referring next to FIG. 2E, the additional insulative structures 106 (FIG. 2D) may be selectively removed (e.g., exhumed) through the slots 162 (see FIG. 1K). Spaces between vertically neighboring (e.g., in the Z-direction) insulative structures 104 may be filled with the conductive material 180 (FIG. 2F) to form the conductive structures 174 and the stack structure 175 including the tiers 176 of the insulative structures 104 and the conductive structures 174. In addition to serving as conductive contacts (e.g., the conductive contacts 140), the structures 152 may also serve as support structures during and/or after the formation of one or more components of the microelectronic device structure 100'.

As shown in FIG. 2E, one or more side surfaces (e.g., lateral side surfaces) of the isolation regions 134 may directly contact side surfaces of the conductive structures 174 of the stack structure 175 along the interfaces 178 (e.g., vertical interfaces), such that the conductive structures 174 are remote (e.g., isolated) from the conductive contacts 140 by the isolation regions 134. The relatively larger lateral dimension of the isolation regions 134 of the microelectronic device structure 100' may facilitate a corresponding increase in a lateral dimension of the third portion 154c laterally adjacent to the uppermost conductive structure 174a of the individual steps 122. The relatively larger lateral dimension of the third portion 154c of the conductive material 154, as a result of the relatively larger lateral dimension of the isolation regions 134, may facilitate an increased contact region between the strapping structures 160 and the uppermost conductive structure 174a of the individual steps 122, without undesirably increasing the overall width (e.g., horizontal footprint) of the staircase region 105 of the microelectronic device structure 100'. After forming the conductive material 180 of the conductive structures 174 of the stack structure 175, the slots 162 (FIG. 1K) may be filled with the dielectric material 166 (FIG. 1K).

Figure 2F:
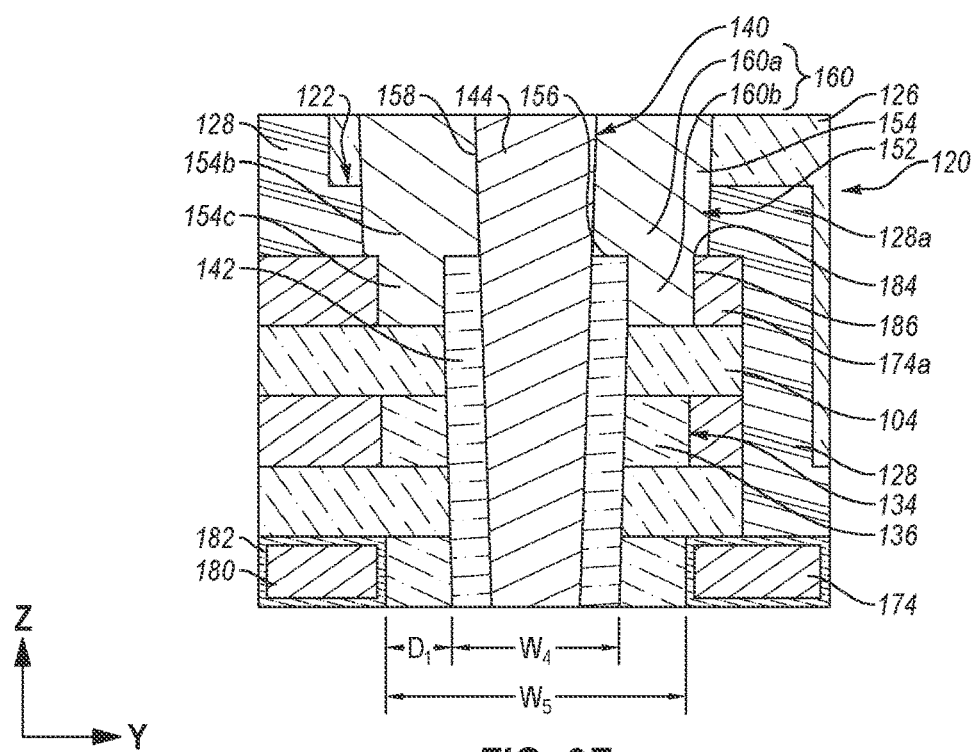

FIG. 2F illustrates an enlarged portion of box F of FIG. 2E, in accordance with the embodiment of the microelectronic device structure 100' of FIG. 2E. The remaining portions of the upper portions 128a of the insulative liner material 128, if present, may laterally (e.g., in the X-direction, in the Y-direction) surround the first portion 160a (e.g., the upper portion) of the strapping structures 160, and the uppermost conductive structure 174a may laterally surround the second portion 160b (e.g., the lower portion) of the strapping structures 160.

The configuration of the strapping structures 160 of the structures 152 of the microelectronic device structure 100' of FIG. 2F differs from the configuration of FIG. 1N. For example, the first portion 160a of the strapping structures 160 may laterally surround the fill material 144 of the conductive contacts 140, without laterally surrounding an upper portion of the liner material 142 thereof at an elevational level of the dielectric fill material 126 and the insulative liner material 128 over each step 122 of the staircase structure 120. As shown in FIG. 2F, the second portion 160b of the strapping structures 160 may laterally surround a remaining portion of the liner material 142 at an elevational level of the uppermost conductive structure 174a of the individual steps 122. Accordingly, the second portion 160b of the strapping structures 160 (also described herein as the third portion 154c of the conductive material 154) of an individual structure 152 may be located below a lowermost boundary of the first portion 160a of the strapping structures 160 (also described herein as the second portion 154b of the conductive material 154) thereof.

The conductive liner material 182 may or may not be present adjacent to the uppermost conductive structure 174a. Accordingly, the conductive material 180 of the uppermost conductive structure 174a of individual steps 122 may be formed directly neighboring (e.g., in the Y-direction, in the Z-direction) the strapping structures 160. Alternatively, at least one material (e.g., the conductive liner material 182) may vertically intervene between the conductive material 180 of the uppermost conductive structure 174a and the strapping structures 160.

As shown in FIG. 2F, lower surfaces of at least some (e.g., each) of the strapping structures 160 may be in physical contact with the uppermost conductive structure 174a along the horizontal interfaces 184, and side surfaces of the strapping structures 160 may be in physical contact with the uppermost conductive structure 174a along the vertical interfaces 186. Accordingly, portions of the strapping structures 160 (e.g., the second portion 160b thereof) may be laterally adjacent to the uppermost conductive structure 174a, and additional portions of the strapping structures 160 (e.g., the first portion 160a thereof) may be vertically adjacent to the uppermost conductive structure 174a. The first portion 160a and the second portion 160b of the strapping structures 160 may form the "L-shaped" structure of the strapping structures 160 proximate the upper surfaces and the side surfaces of the uppermost conductive structure 174a of the individual steps 122, such that the strapping structures 160 of the microelectronic device structure 100' physically contact the uppermost conductive structure 174a on at least two consecutive sides.

The first portion 160a and the second portion 160b of the strapping structures 160 of the microelectronic device structure 100' may be configured (e.g., sized and shaped) to maximize (e.g., increase) overlap with the contact region of the uppermost conductive structure 174a of the individual steps 122. For example, a lateral dimension (e.g., the fourth width $W_4$, a diameter in the Y-direction) of the second portion 142b (e.g., the lower portion) of the liner material 142 of the microelectronic device structure 100' of the embodiment of FIG. 2F may be relatively less than that of the embodiment of FIG. 1N, as a result of the thickness of the liner material 142 of the conductive contacts 140 being relatively less than that of the previous embodiment. In some embodiments, the fourth width $W_4$ of the second portion 142b of the liner material 142 may be within a range of from about 100 nm to about 400 nm, such as from about 100 nm to about 200 nm, from about 200 nm to about 300 nm, or from about 300 nm to about 400 nm. However, the disclosure is not so limited and the fourth width $W_4$ may be different than those described above. A decrease in the fourth width $W_4$ may facilitate an increased lateral dimension of the third portion 154c of the conductive material 154 laterally adjacent to the liner material 142.

As shown in FIG. 2F, the uppermost conductive structure 174a may be separated from the liner material 142 of the conductive contacts 140, by the strapping structures 160 (e.g., the second portion 160b thereof), by the distance $D_1$ in the Y-direction. Since the lateral dimension of the liner material 136 within the isolation regions 134 of the embodiment of FIG. 2B of the microelectronic device structure 100' is relatively larger than that of the previous embodiment, the distance $D_1$ of the embodiment of FIG. 2F is relatively larger than that of the embodiment of FIG. 1N. By way of non-limiting example, the distance $D_1$ may be within a range of from about 40 nm to about 200 nm, such as from about 40 nm to about 80 nm, from about 80 nm to about 120 nm, from about 120 nm to about 160 nm, or from about 160 nm to about 200 nm. In some embodiments, the distance $D_1$ is about 160 nm. However, the disclosure is not so limited and the distance $D_1$ may be different than those described above.

In some embodiments, a lateral dimension (e.g., the fifth width $W_5$) of the second portion 160b of the strapping structures 160 of the microelectronic device structure 100' of the embodiment of FIG. 2F may be relatively larger than that of the embodiment of FIG. 1N, as a result of the distance $D_1$ being relatively larger than that of the previous embodiment. In some embodiments, the fifth width $W_5$ of the second portion 160b of the strapping structures 160 may be within a range of from about 200 nm to about 550 nm, such as from about 200 nm to about 250 nm, from about 250 nm to about 350 nm, from about 350 nm to about 450 nm, or from about 450 nm to about 550 nm. However, the disclosure is not so limited and the fifth width $W_5$ may be different than those described above. In other embodiments, the fifth width $W_5$ may be relatively less than or, alternatively, substantially the same as (e.g., substantially equal to) that of the embodiment of FIG. 1N.

The shape of the structures 152 of the microelectronic device structure 100' may further enhance (e.g., further increase) the contact region with the uppermost conductive structure 174a of the individual steps 122 by varying the size, shape, and orientation of the strapping structures 160 to further increase the surface area available for contact with the uppermost conductive structure 174a. As a result, the RC (product of resistance and capacitance) of the structures 152 including the conductive contacts 140 and the strapping structures 160 may be optimized, which may correlate to a further increase in the performance of a device containing the microelectronic device structure 100'.

Figure 3:
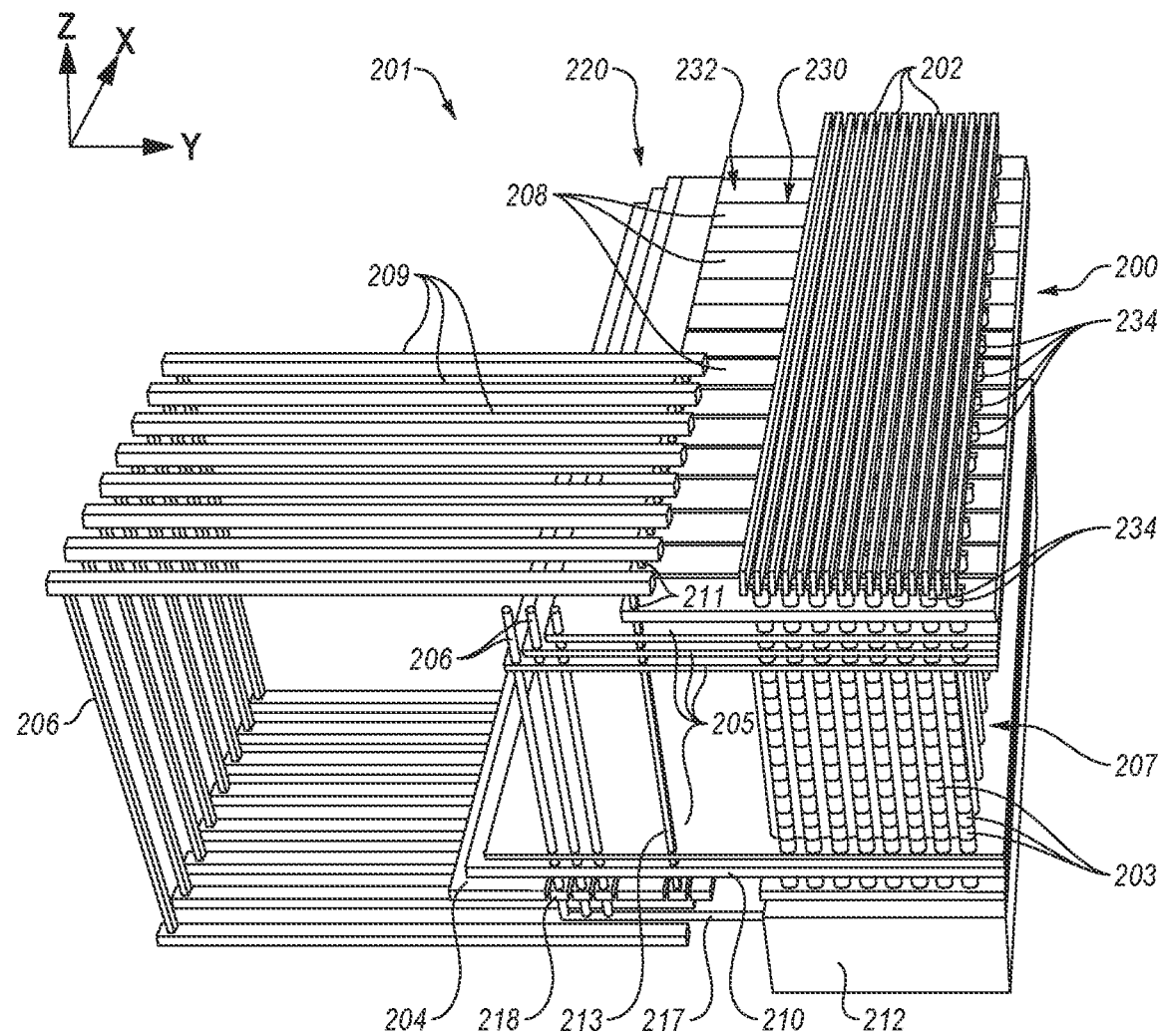
FIG. 3 is a simplified, partial cutaway perspective view of a microelectronic device, in accordance with embodiments of the disclosure.

FIG. 3 illustrates a simplified, partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structures 100, 100' following the processing stage previously described with reference to FIGS. 1K and 1L, and FIG. 2E. As shown in FIG. 3, the microelectronic device structure 200 may include a staircase structure 220 (e.g., including the staircase structure 120 (FIGS. 1L and 2E)) defining contact regions for connecting conductive contacts 206 (e.g., corresponding to the conductive contacts 140 (FIGS. 1L and 2E)) directly to conductive tiers 205 (e.g., conductive layers, conductive plates, such as the conductive structures 174 (FIGS. 1L and 2E)). The microelectronic device structure 200 may include vertically extending strings 207 of memory cells 203 that are coupled to each other in series. The vertically extending strings 207 may extend vertically (e.g., in the Z-direction) and orthogonally to data lines 202, a source tier 204 (e.g., corresponding to the source tier 110 (FIGS. 1L and 2E)), the conductive tiers 205, first select gates 208 (e.g., upper select gates, drain select gates (SGDs)), select lines 209, and a second select gate 210 (e.g., a lower select gate, a source select gate (SGS)). The microelectronic device 201 may include multiple blocks 232 (e.g., corresponding to the block structures 164 (FIG. 1K)) horizontally separated (e.g., in the X-direction) from one another by filled slot structures 230 (e.g., corresponding to the slots 162 (FIG. 1K) filled with the dielectric material 166 (FIG. 1K)).

Conductive contacts 213 and additional conductive contacts 211 may, optionally, electrically couple components to each other as shown. For example, the select lines 209 may be electrically coupled to the first select gates 208. The microelectronic device 201 may also include a control unit 212 positioned under and within a horizontal area of the memory array including the vertically extending strings 207 of memory cells 203. The control unit 212 may include control logic devices configured to control various operations of other features (e.g., the vertically extending strings 207 of memory cells 203) of the microelectronic device 201. By way of non-limiting example, the control unit 212 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 212 may be electrically coupled to the data lines 202, the source tier 204, the conductive contacts 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration, wherein the CMOS circuitry of a logic region is at least partially (e.g., substantially) positioned within horizontal areas of memory array regions of a microelectronic device including the microelectronic device structures 100, 100'. The conductive material 154 (FIG. 1L) of the strapping structures 160 (FIG. 1L) and the fill material 144 (FIG. 1L) of the conductive contacts 140 (FIG. 1L) may be operably coupled to logic circuitry of the control unit 212 underlying the source tier 204, without additional conductive tiers 205 below steps of the staircase structure 220 being operably coupled to the logic circuitry of the control unit 212.

Source structures 218 (e.g., corresponding to the source structure(s) 118 (FIG. 1B)) of the source tier 204 may be electrically isolated from other portions thereof (e.g., other portions employed as conductive routing structures 217 (e.g., corresponding to the conductive routing structures 117 (FIG. 1B))). The conductive routing structures 217 may electrically couple components (e.g., the conductive contacts 206, the source structures 218) to circuitry of the control unit 212.

The first select gates 208 may extend horizontally in a first direction (e.g., the Y-direction) and may be coupled to respective first groups of vertically extending strings 207 of memory cells 203 at a first end (e.g., an upper end) of the vertically extending strings 207. The second select gate 210 may be formed in a substantially planar configuration and may be coupled to the vertically extending strings 207 at a second, opposite end (e.g., a lower end) of the vertically extending strings 207 of memory cells 203.

The data lines 202 (e.g., bit lines) may extend horizontally in a second direction (e.g., in the X-direction) that is at an angle (e.g., perpendicular) to the first direction in which the first select gates 208 extend. The data lines 202 may be coupled to respective second groups of the vertically extending strings 207 at the first end (e.g., the upper end) of the vertically extending strings 207. A first group of vertically extending strings 207 coupled to a respective first select gate 208 may share a particular vertically extending string 207 with a second group of vertically extending strings 207 coupled to a respective data line 202. Thus, a particular vertically extending string 207 may be selected at an intersection of a particular first select gate 208 and a particular data line 202. Accordingly, the first select gates 208 may be used for selecting memory cells 203 of the vertically extending strings 207 of memory cells 203.

The conductive tiers 205 (e.g., word line plates, such as the conductive structures 174 (FIGS. 1L and 2E)) may extend in respective horizontal planes. The conductive tiers 205 may be stacked vertically, such that each conductive tier 205 is coupled to all of the vertically extending strings 207 of memory cells 203, and the vertically extending strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertically extending string 207 of memory cells 203.

The first select gates 208 and the second select gates 210 may operate to select a particular vertically extending string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection directly between the conductive contacts 206 and the conductive tiers 205. In other words, a particular conductive tier 205 may be selected via a conductive contact 206 in electrical communication therewith. The data lines 202 may be electrically coupled to the vertically extending strings 207 through conductive contact structures 234.

Thus, in accordance with embodiments of the disclosure a microelectronic device comprises a stack structure overlying a source tier. The stack structure comprises a vertically alternating sequence of conductive structures and insulative structures arranged in tiers. The microelectronic device comprises a staircase structure within the stack structure and having steps comprising lateral edges of the tiers, conductive contacts within a horizontal area of the staircase structure and vertically extending through the stack structure to the source tier, and strapping structures laterally adjacent to the conductive contacts and having upper surfaces substantially coplanar with upper surfaces of the conductive contacts. Each of the strapping structures are in contact with one of the conductive contacts and with one of the conductive structures of the stack structure at one of the steps of the staircase structure.

Thus, in accordance with additional embodiments of the disclosure, a memory device comprises a stack structure comprising conductive structures vertically interleaved with insulative structures, strings of memory cells vertically extending through the stack structure, a staircase structure within the stack structure and having steps defined by lateral ends of the conductive structures and the insulative structures, and conductive contact structures vertically extending through the stack structure. Each of the conductive contact structures individually comprise an inner conductive core vertically extending from an uppermost boundary of the stack structure to conductive material underlying a lowermost boundary of the stack structure, and an outer conductive shell laterally surrounding portions of the inner conductive core and in physical contact with one of the conductive structures of the stack structure at an elevational level of one of the steps of the staircase structure.

Furthermore, in accordance with further embodiments of the disclosure, a method of forming a microelectronic device comprises forming a stack structure over a source tier including one or more conductive structures. The stack structure comprises tiers each including an insulative material and additional insulative material vertically neighboring the insulative material. The method comprises forming dielectric material over a staircase structure within the stack structure. The staircase structure has steps comprising lateral edges of the tiers of the stack structure. The method comprises forming openings extending through the stack structure and within a horizontal area of the staircase structure. The openings expose portions of the one or more conductive structures of the source tier. The method comprises forming conductive contacts individually comprising liner material and conductive fill material within the openings, forming conductive material laterally adjacent and in contact with portions of the conductive contacts vertically overlying the staircase structure to form strapping structures in contact with the steps of the staircase structure, and at least partially replacing the additional insulative material with additional conductive material to form additional conductive structures. The conductive contacts are coupled to the additional conductive structures by way of the strapping structures.

Figure 4:
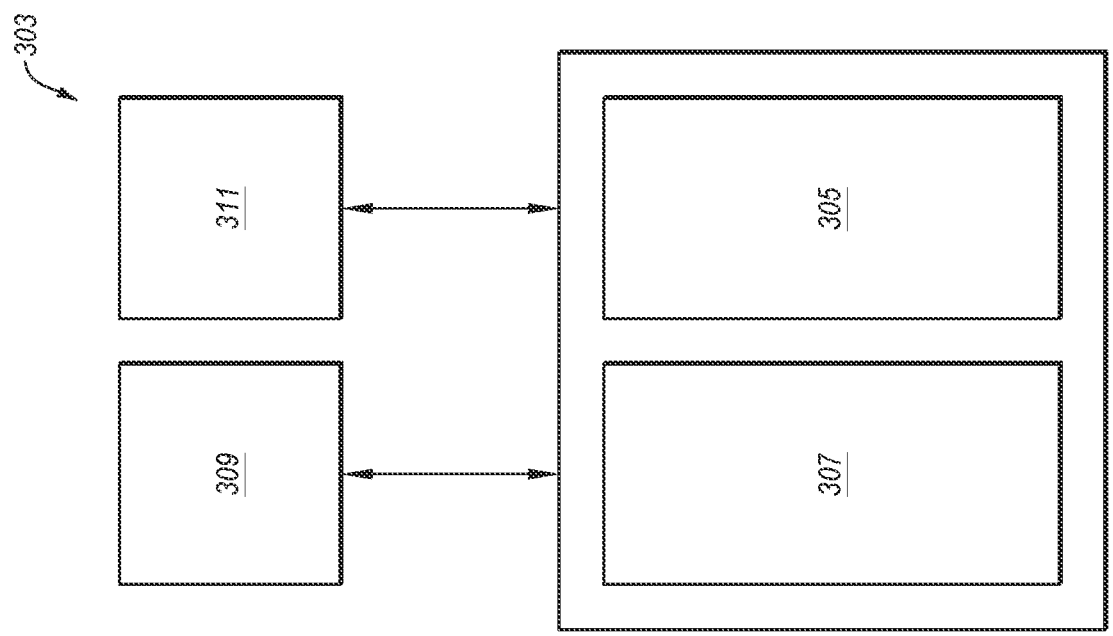
FIG. 4 is a schematic block diagram of an electronic system, in accordance with embodiments of the disclosure.

Microelectronic devices (e.g., the microelectronic device 201) including microelectronic device structures (e.g., the microelectronic device structures 100, 100', 200) of the disclosure may be included in embodiments of electronic systems of the disclosure. For example, FIG. 4 is a schematic block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structures 100, 100', 200 previously described with reference to FIGS. 1A through 2F and FIG. 3) or a microelectronic device (e.g., the microelectronic device 201) previously described with reference to FIG. 3.

The electronic system 303 may further include at least one electronic signal processor device 307 (often referred to as a "microprocessor"). The electronic signal processor device 307 may, optionally, include an embodiment of one or more of a microelectronic device and a microelectronic device structure previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 5:
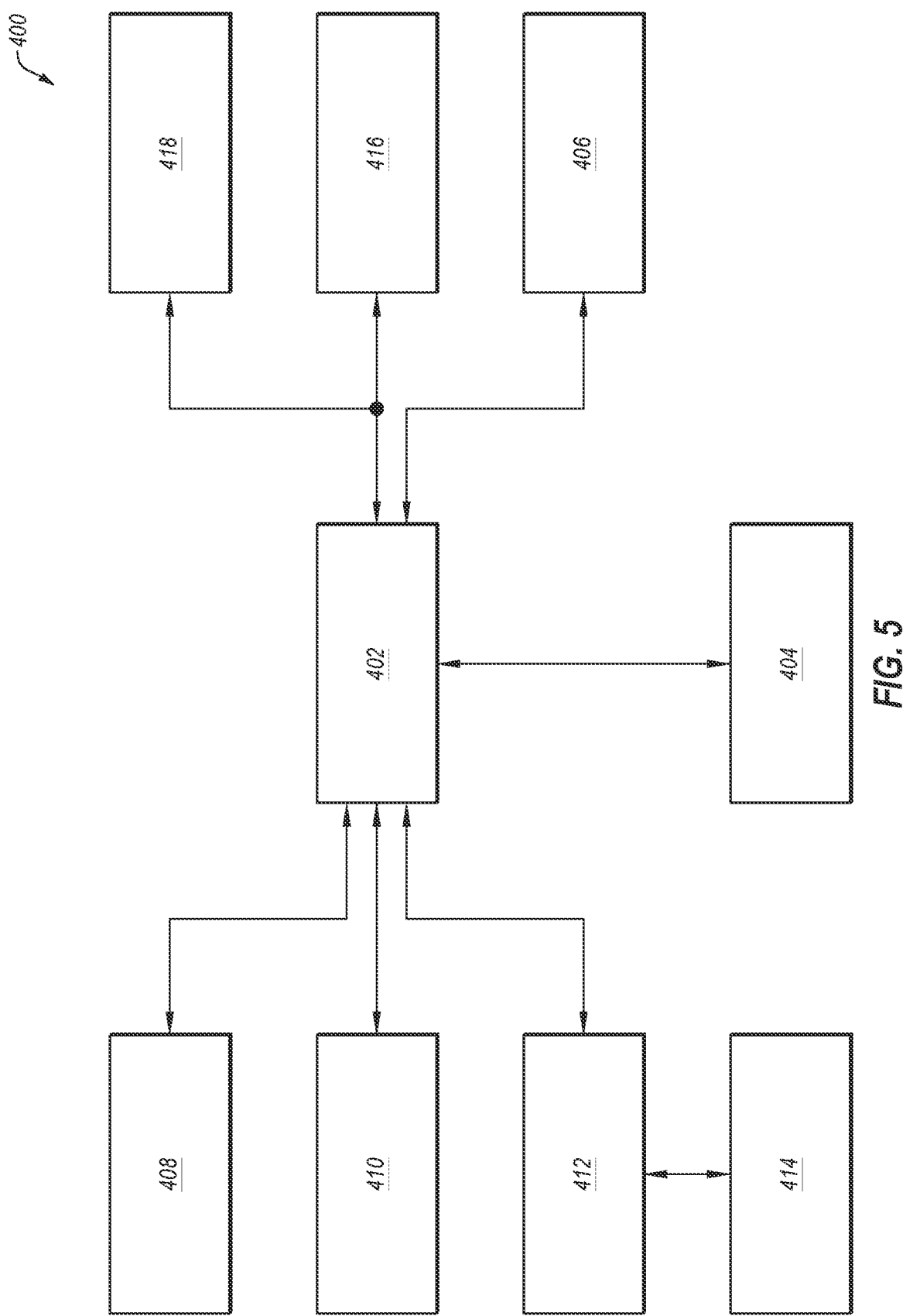
FIG. 5 is a schematic block diagram of a processor-based system, in accordance with embodiments of the disclosure.

With reference to FIG. 5, depicted is a processor-based system 400. The processor-based system 400 may include one or more of a microelectronic device and a microelectronic device structure previously described herein and manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include one or more of a microelectronic device and a microelectronic device structure previously described herein and manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random-access memory (STT-MRAM), magnetic random-access memory (MRAM), dynamic random-access memory (DRAM), static random-access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as one or more of a microelectronic devices and a microelectronic device structure previously described herein.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as one or more of a microelectronic device and a microelectronic device structure previously described herein.

Thus, in accordance with embodiments of the disclosure an electronic system comprises a processor operably coupled to an input device and an output device, and a memory device operably coupled to the processor. The memory device comprises a stack structure comprising dielectric materials and conductive materials vertically alternating with the dielectric materials, conductive contacts vertically extending through the stack structure from an uppermost boundary of the stack structure to conductive routing structures underlying a lowermost boundary of the stack structure, and conductive structures substantially surrounding upper portions of the conductive contacts. At least some of the conductive materials of the stack structure are in electrical communication with at least some of the conductive routing structures through the conductive contacts and the conductive structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a stack structure overlying a source tier, the stack structure comprising a vertically alternating sequence of conductive structures and insulative structures arranged in tiers;
a staircase structure within the stack structure and having steps comprising lateral edges of the tiers;
conductive contacts within a horizontal area of the staircase structure and vertically extending through the stack structure to the source tier; and
strapping structures laterally adjacent to the conductive contacts and having upper surfaces substantially coplanar with upper surfaces of the conductive contacts, each of the strapping structures in contact with one of the conductive contacts and with one of the conductive structures of the stack structure at one of the steps of the staircase structure.

2. The microelectronic device of claim 1, wherein each of the strapping structures physically contact the one of the conductive structures of the stack structure on a lateral side and on a vertical side.

3. The microelectronic device of claim 1, wherein:
the conductive contacts comprise conductive material at least partially laterally surrounded by a liner material; and
the strapping structures are coupled to upper portions of the conductive material of the conductive contacts and are physically separated from lower portions of the conductive material of the conductive contacts by the liner material.

4. The microelectronic device of claim 1, wherein the conductive contacts vertically extend through the stack structure from an upper surface of the stack structure to conductive features within the source tier.

5. The microelectronic device of claim 1, wherein:
each of the conductive contacts exhibits substantially the same vertical height; and
the steps of the staircase structure are free of additional conductive contacts terminating thereon.

6. The microelectronic device of claim 1, wherein the strapping structures substantially laterally surround and physically contact upper portions of the conductive contacts above an elevational level of individual steps of the staircase structure, without being laterally adjacent and in physical contact with lower portions of the conductive contacts within the stack structure.

7. The microelectronic device of claim 1, further comprising at least one dielectric material overlying the stack structure, wherein conductive portions of the conductive contacts physically contact the strapping structures along a vertical extent of upper portions of the conductive contacts laterally adjacent to the at least one dielectric material.

8. A memory device, comprising:
a stack structure comprising conductive structures vertically interleaved with insulative structures;
strings of memory cells vertically extending through the stack structure;
a staircase structure within the stack structure and having steps defined by lateral ends of the conductive structures and the insulative structures; and
conductive contact structures vertically extending through the stack structure, each of the conductive contact structures individually comprising:
an inner conductive core vertically extending from an uppermost boundary of the stack structure to conductive material underlying a lowermost boundary of the stack structure; and
an outer conductive shell laterally surrounding portions of the inner conductive core and in physical contact with one of the conductive structures of the stack structure at an elevational level of one of the steps of the staircase structure.

9. The memory device of claim 8, further comprising insulative material laterally intervening between lower portions of the inner conductive core and the outer conductive shell of each of the conductive contact structures, an upper portion of the outer conductive shell overlying the insulative material and physically contacting the inner conductive core.

10. The memory device of claim 8, wherein the outer conductive shell of each of the conductive contact structures is in physical contact with the one of the conductive structures of the stack structure on at least two consecutive sides thereof.

11. The memory device of claim 8, further comprising isolation regions individually laterally separating the inner conductive core of one of the conductive contact structures from additional conductive structures below individual steps of the stack structure, wherein a lateral dimension of the outer conductive shell of the one of the conductive contact structures is relatively greater than a lateral dimension of one of the isolation regions most proximate thereto.

12. The memory device of claim 8, further comprising an insulative liner material overlying the steps of the staircase structure, a width of the outer conductive shell of each of the conductive contact structures laterally adjacent to the insulative liner material relatively larger than an additional width of the outer conductive shell laterally adjacent to the one of the conductive structures of the stack structure.

13. An electronic system, comprising:
a processor operably coupled to an input device and an output device; and
a memory device operably coupled to the processor, the memory device comprising:
a stack structure comprising dielectric materials and conductive materials vertically alternating with the dielectric materials;
conductive contacts vertically extending through the stack structure from an uppermost boundary of the stack structure to conductive routing structures underlying a lowermost boundary of the stack structure; and
conductive structures substantially surrounding upper portions of the conductive contacts, at least some of the conductive materials of the stack structure in electrical communication with at least some of the conductive routing structures through the conductive contacts and the conductive structures.

* * * * *